(12) United States Patent
Richter et al.

(10) Patent No.: US 11,772,201 B2
(45) Date of Patent: Oct. 3, 2023

(54) METHOD FOR SEPARATING SOLID BODY LAYERS FROM COMPOSITE STRUCTURES MADE OF SIC AND A METALLIC COATING OR ELECTRICAL COMPONENTS

(71) Applicant: SILTECTRA GmbH, Dresden (DE)

(72) Inventors: Jan Richter, Dresden (DE); Marko Swoboda, Dresden (DE)

(73) Assignee: Siltectra GmbH, Dresden (DE)

( * ) Notice: Subject to any disclaimer, the term of this patent is extended or adjusted under 35 U.S.C. 154(b) by 1172 days.

(21) Appl. No.: 16/402,355

(22) Filed: May 3, 2019

(65) Prior Publication Data

US 2019/0337100 A1    Nov. 7, 2019

(30) Foreign Application Priority Data

May 4, 2018 (DE) .......................... 102018003675.9

(51) Int. Cl.
*B23K 26/53* (2014.01)
*B23K 26/0622* (2014.01)
(Continued)

(52) U.S. Cl.
CPC .......... *B23K 26/53* (2015.10); *B23K 26/0006* (2013.01); *B23K 26/0622* (2015.10);
(Continued)

(58) Field of Classification Search
CPC ................ B23K 26/53; B23K 26/0622; B23K 26/0006; B23K 26/0648; B23K 2103/56;
(Continued)

(56) References Cited

U.S. PATENT DOCUMENTS 7,838,794 B2 * 11/2010 Gu .......................... B23K 26/04
                                                                    219/121.68
8,828,506 B2 *  9/2014 Ruuttu ..................... C23C 14/28
                                                                         427/596
(Continued)

FOREIGN PATENT DOCUMENTS

CN      102308372 A    1/2012
CN      105899325 A    8/2016
(Continued)

OTHER PUBLICATIONS

Xueshi Bai. Laser-induced plasma as a function of the laser parameters and the ambient gas. Plasma Physics [physics.plasm-ph]. Université Claude Bernard—Lyon I, 2014. English. ffNNT : 2014LYO10333ff. fftel-01127499.*

(Continued)

*Primary Examiner* — Brian W Jennison
(74) *Attorney, Agent, or Firm* — Murphy, Bilak & Homiller, PLLC

(57) ABSTRACT

A method for producing microcracks in an interior of a composite structure includes: providing or producing the composite structure which has a solid body and at least one metallic coating and/or electrical components situated or provided on one side of the solid body, the solid body containing or being made of silicon carbide (SiC); and producing modifications in the interior of the solid body. Laser radiation is introduced into a flat surface of the solid body to cause multiphoton excitation which brings about plasma generation. The modifications are effected by the plasma in the form of a material transformation which generates compressive stresses in the solid body, thereby developing subcritical cracks in a surrounding area of a particular modification. The laser radiation is introduced into the solid body in pulses having an intensity which (Continued)

reaches a maximum within 10 ns after a start of a particular pulse.

19 Claims, 13 Drawing Sheets

(51) Int. Cl.
| | |
|---|---|
| *B23K 26/00* | (2014.01) |
| *B23K 26/06* | (2014.01) |
| *B23K 26/08* | (2014.01) |
| *B23K 103/00* | (2006.01) |
| *B28D 5/00* | (2006.01) |
| *H01L 29/16* | (2006.01) |

(52) U.S. Cl.
CPC ...... *B23K 26/0648* (2013.01); *B23K 26/0853* (2013.01); *B23K 26/0823* (2013.01); *B23K 2103/56* (2018.08); *B28D 5/0011* (2013.01); *H01L 29/1608* (2013.01)

(58) Field of Classification Search
CPC .............. B23K 26/0736; B23K 26/384; B23K 26/382; B23K 26/064; B23K 26/55; B23K 26/40; B23K 26/359; B23K 26/0624; B23K 26/032; B23K 26/36; B23K 26/38; B23K 26/702; B23K 26/04; B23K 37/0408; B23K 26/037; B23K 26/146; B23K 26/70; B23K 26/14; B23K 26/60; B23K 26/0093; B23K 26/50; B23K 26/244; B23K 26/0673; B23K 26/067; B23K 26/0626; B23K 26/073; B23K 26/0676; B23K 26/0604; B23K 26/21; B23K 26/324; B28D 5/0011; B28D 5/0005; B28D 1/221; B28D 5/0064; B28D 5/0023; B28D 5/00; B28D 1/005; H01L 29/1608; H01L 21/30608; H01L 21/76254; H01L 21/268; H01L 21/02002; H01L 31/1896; H01L 21/76259; H01L 23/562; H01L 31/1892; H01L 23/544; H01L 21/302; H01L 21/2855; H01L 21/4878; H01L 21/304; H01L 21/02422; H01L 21/02354; H01L 21/324; H01L 21/76251; H01L 31/1804; H01L 21/02005; H01L 21/67092; H01L 21/3221; H01L 21/02019; H01L 33/0093; H01L 31/0682; H01L 31/022441; H01L 31/18; H01L 29/045; H01L 21/67115; H01L 21/67282; H01L 21/02024; H01L 21/02008; H01L 21/02686; H01L 29/685; H01L 21/2636; H01L 31/1872; H01L 21/02568; H01L 21/02532; C30B 29/36; C30B 33/04; C30B 33/06; C30B 29/42; C30B 13/24; C30B 29/403; C30B 25/18; C30B 25/105; C30B 23/02; C30B 29/04; H01S 5/0201; C03B 30/0222; C03B 33/091; C03B 33/04; C03B 33/102; C03B 23/006; B81C 1/00634; B81C 1/0038; B81C 1/00357; B81C 1/0088; B42D 25/00; H01J 37/32339; C23C 14/28; C23C 14/0605; C23C 14/22; C23C 16/27; C23C 16/4418; C23C 16/26; H04L 29/06; H04L 1/1621; H04L 1/1809; B05D 3/06; G21K 1/06; G02B 5/0891; B29C 65/1635; B29C 65/1629; B29C 65/1638; B29C 66/73366; B29C 65/1654; B29C 66/43; B29C 66/1122; B29C 66/836; B41M 5/26; C03C 23/0025
See application file for complete search history.

(56) References Cited

U.S. PATENT DOCUMENTS

| | | | |
|---|---|---|---|
| 2005/0205538 | A1 | 9/2005 | Li |
| 2012/0211477 | A1* | 8/2012 | Chacin ................. B23K 26/035 219/121.68 |
| 2015/0132541 | A1* | 5/2015 | McDonald ............. C25D 11/18 219/121.85 |
| 2017/0330800 | A1* | 11/2017 | Beyer ..................... H01L 21/78 |
| 2018/0001416 | A1* | 1/2018 | Richter ............. H01L 21/02002 |

FOREIGN PATENT DOCUMENTS

| | | | | |
|---|---|---|---|---|
| DE | 102014218759 | A1 | | 3/2015 |
| DE | 102015000451 | A1 * | 7/2016 | ......... B23K 26/0624 |
| DE | 102017206178 | A1 | | 10/2017 |
| EP | 2599582 | A1 | | 6/2013 |
| JP | 2007253156 | A | | 10/2007 |
| JP | 2009226457 | A | | 10/2009 |
| JP | 2014036062 | A | | 2/2014 |
| JP | 2015074002 | A | | 4/2015 |
| JP | 2016164908 | A | | 9/2016 |
| JP | 2016215231 | A * | 12/2016 | |
| JP | 2016215231 | A | | 12/2016 |
| TW | 587346 | B | | 5/2004 |
| TW | 200929758 | A | | 7/2009 |

OTHER PUBLICATIONS

Watanabe, Ryosuke, et al., "Optical Properties of Spin-Coated TiO2 Antireflection Films on Textured Single-Crystalline Silicon Substrates", Hindawi Publishing Corporation, International Journal of Photoenergy, 2015, accessed online at https://www.hindawi.com/journals/ijp/2015/147836/ on Apr. 26, 2019.

* cited by examiner

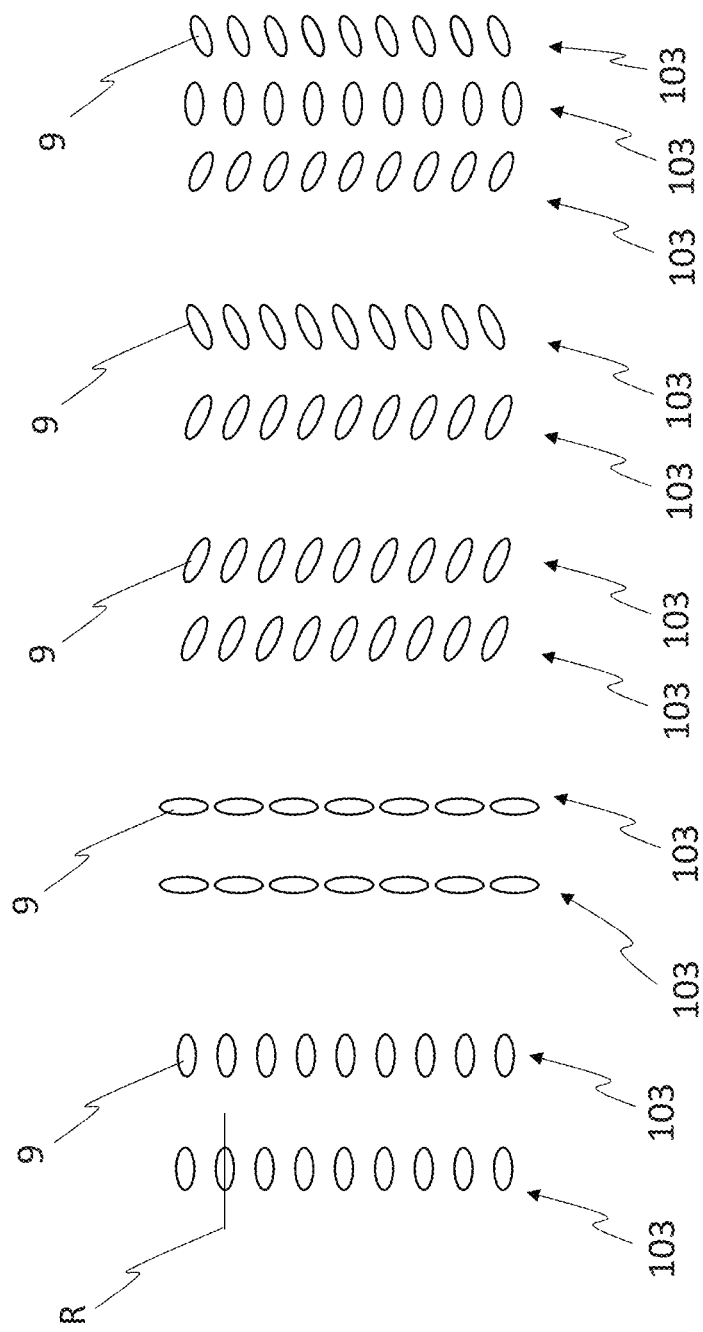

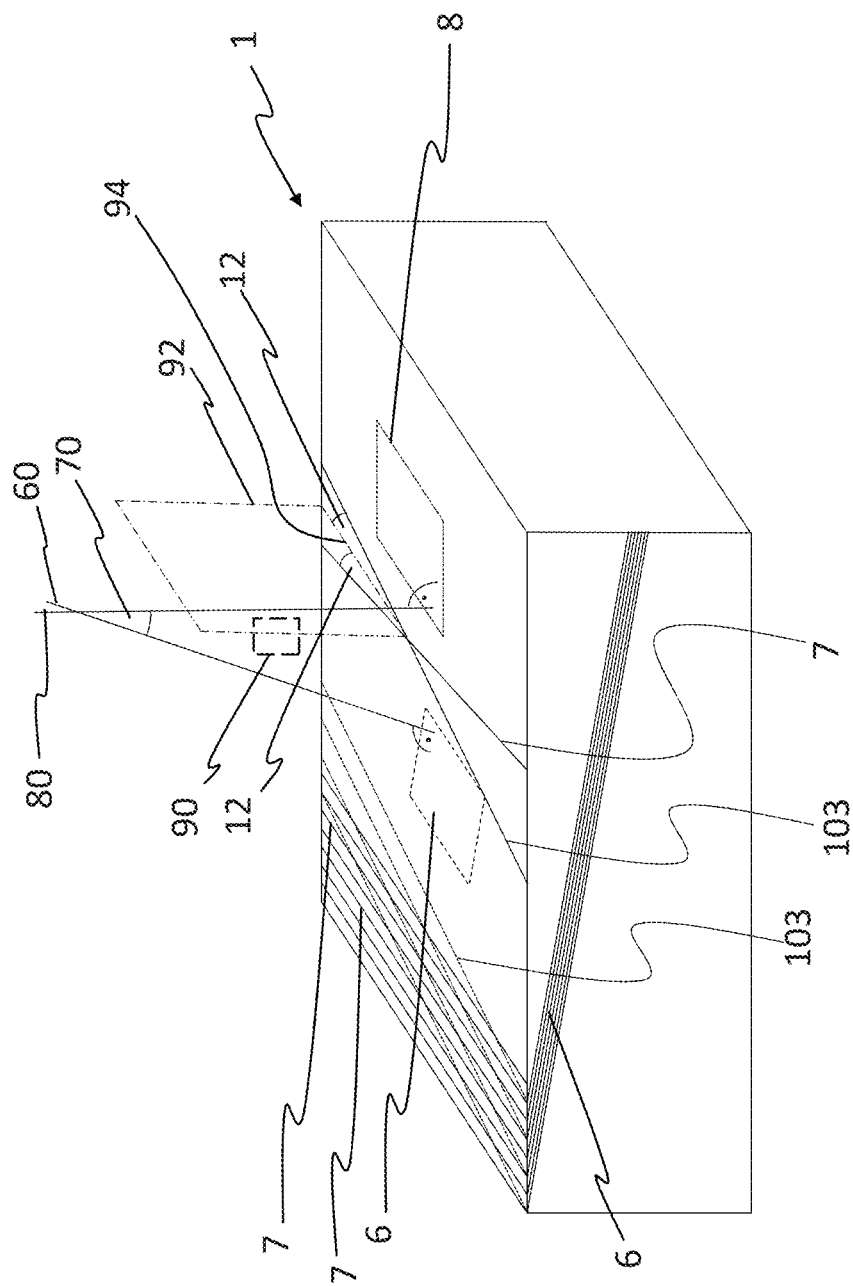

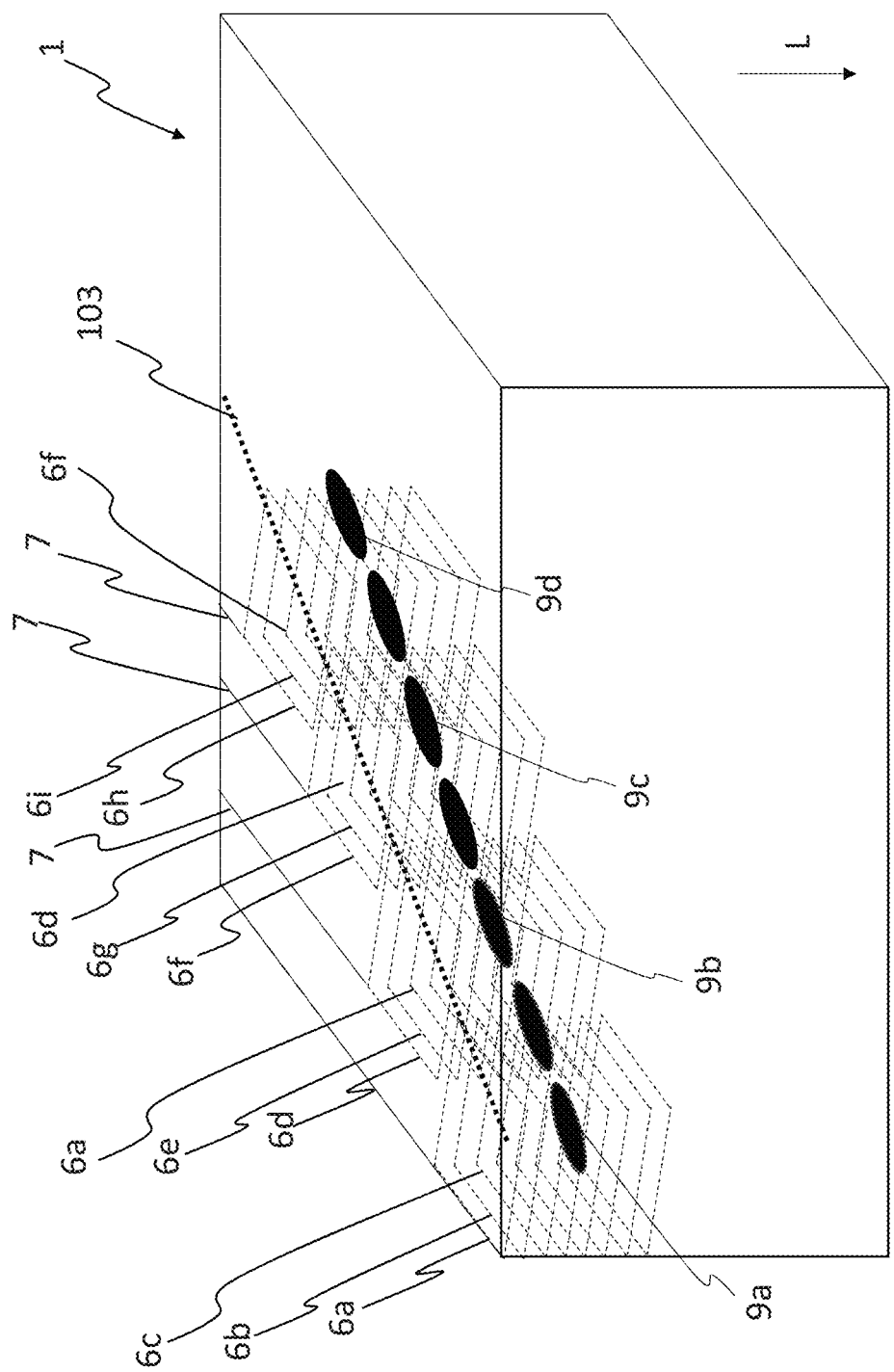

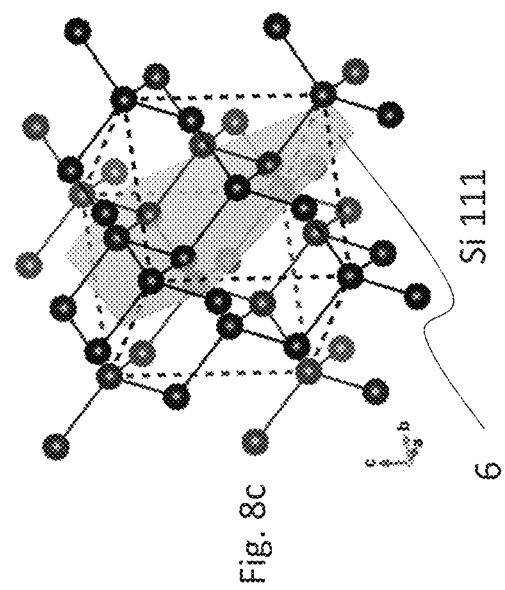
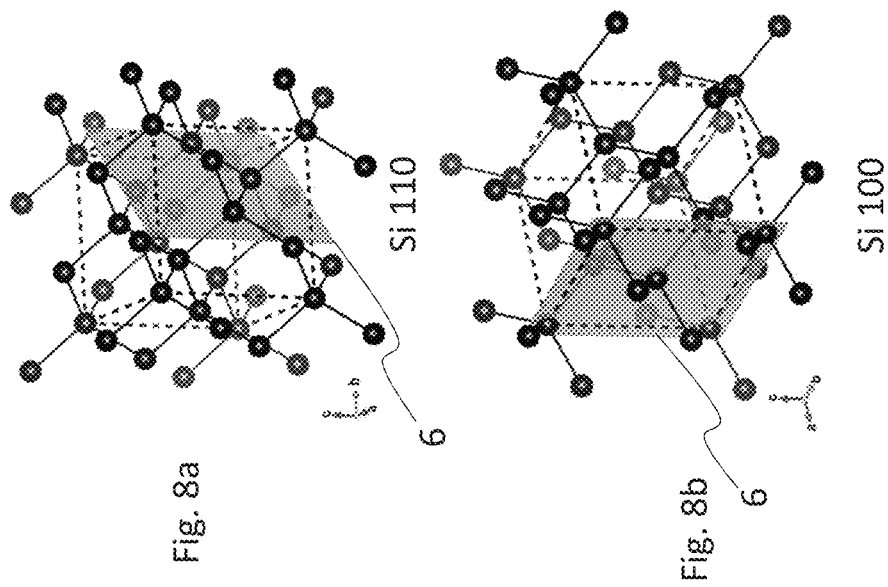

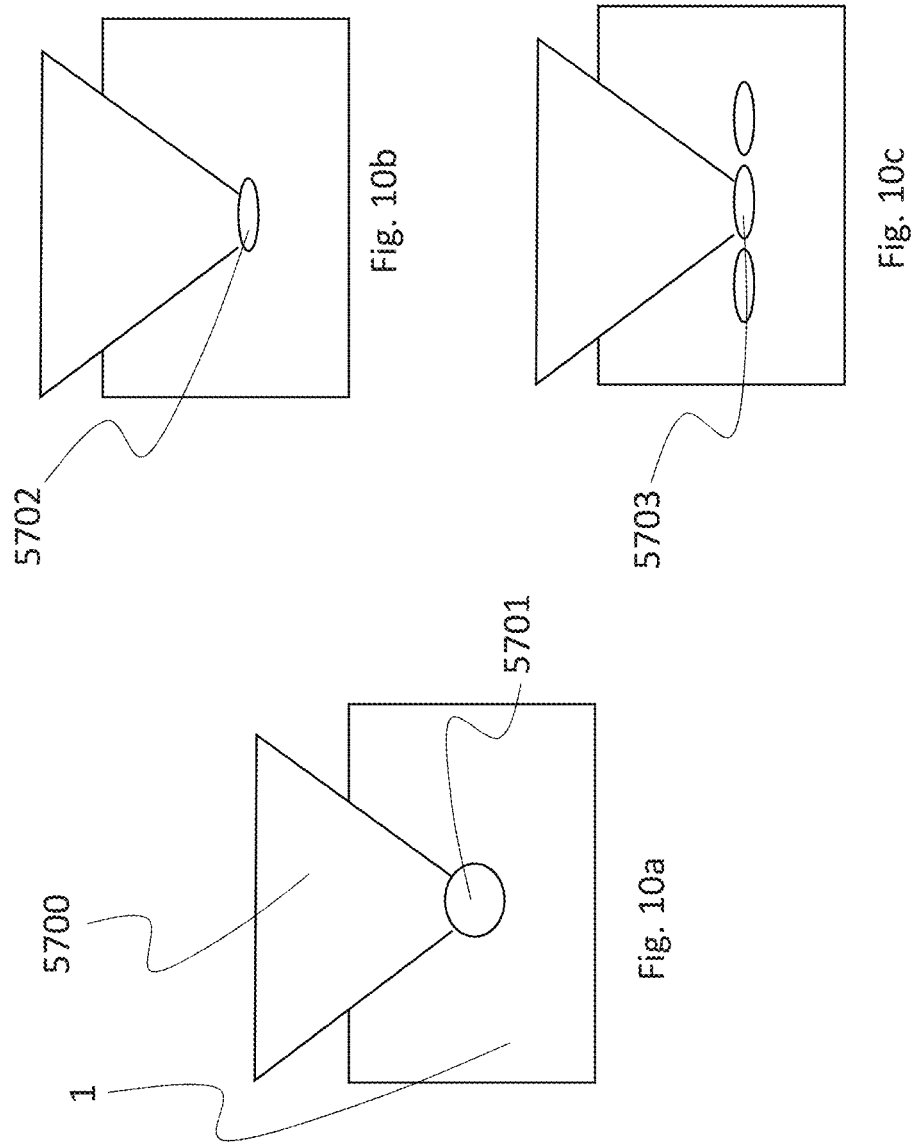

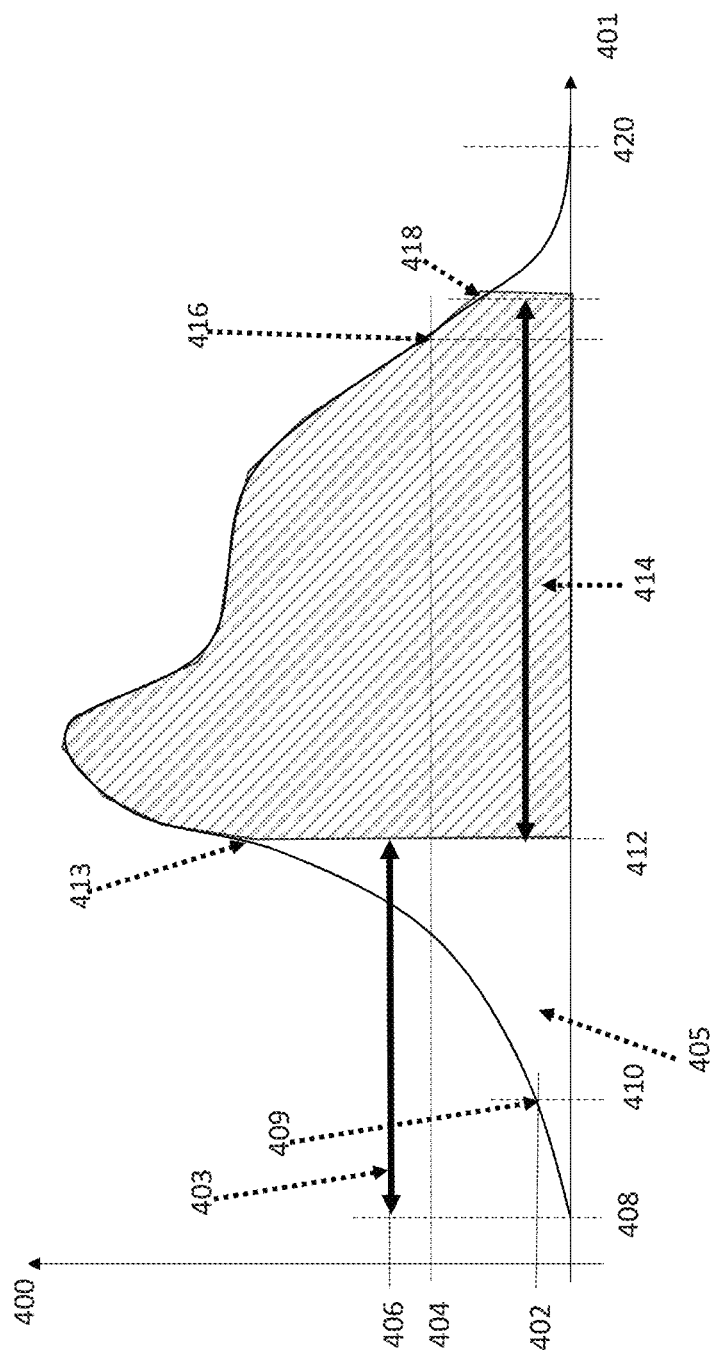

METHOD FOR SEPARATING SOLID BODY LAYERS FROM COMPOSITE STRUCTURES MADE OF SIC AND A METALLIC COATING OR ELECTRICAL COMPONENTS

TECHNICAL FIELD

The present invention according to Claims 1 and 14 relates in each case to a method for producing modifications in the interior of a solid body, and according to Claim 15 relates to a method for separating at least one solid body layer from a solid body.

BACKGROUND

The publication DE 102017206178 A1 discloses a wafer manufacturing method for manufacturing a wafer from a cylindrical SiC monocrystalline ingot that has a cylindrical circumferential surface with a first orientation plane, and a second orientation plane that is shorter than the first orientation plane and perpendicular to the first orientation plane, and a circular upper surface, wherein the cylindrical SiC monocrystalline ingot has a c axis that is inclined from a vertical axis perpendicular to the circular upper surface in the direction of the second orientation plane, and has a deviation angle that is formed between a c plane perpendicular to the c axis and the upper surface, wherein the wafer manufacturing method includes: a detection step for a machining feed direction, with confirmation of whether or not a direction in which the c axis is inclined and the second orientation plane are perpendicular to one another, and detection of a machining feed direction perpendicular to the direction in which the c axis is inclined; a formation step for an area of reduced strength, with positioning of the focal point of a laser beam, starting from the circular upper surface, at a depth in the cylindrical SiC monocrystalline ingot, wherein the depth corresponds to the thickness of a wafer to be manufactured, and during a relative movement of the cylindrical SiC monocrystalline ingot and the focal point in the machining feed direction, which has been detected in the detection step for a machining feed direction; irradiating the cylindrical SiC monocrystalline ingot with a laser beam that has a wavelength that transmits [through] SiC in order to form a straight area of reduced strength, made up of a modified layer that is parallel to the circular upper surface, and cracks that extend from the modified layer at a depth along the c plane that corresponds to the thickness of the wafer to be manufactured; a peeling plane formation step with formation of a peeling plane in the cylindrical SiC monocrystalline ingot by carrying out the formation step multiple times for an area of reduced strength, with predetermined distances in a direction perpendicular to the machining feed direction; and after the peeling plane formation step, a wafer manufacturing step with manufacture of a wafer from the cylindrical SiC monocrystalline ingot by peeling off a portion of the cylindrical SiC monocrystalline ingot from the peeling plane that serves as a boundary face; wherein the detection step for a machining feed direction includes: a scanning step with carrying out of scanning radiation for positioning the focal point of a laser beam, starting from the circular upper surface, at a predetermined depth in the cylindrical SiC monocrystalline ingot, and while moving the cylindrical SiC monocrystalline ingot and the focal point relative to one another, irradiating the cylindrical SiC monocrystalline ingot with a laser beam having a wavelength that transmits [through] SiC, along a direction parallel to the second orientation plane and a plurality of directions that are inclined, starting from the second orientation plane, by respective modified angles in the clockwise and counter-clockwise directions, in order to form a plurality of scanned straight areas of reduced strength in the cylindrical SiC monocrystalline ingot, wherein each of the scanned straight areas of reduced strength is made up of a modified layer in parallel to the circular upper surface, and cracks that extend from the modified layer along the c plane; and a determining step with recording of respective images of the scanned straight areas of reduced strength, using imaging means, measuring the number of nodes that are present in one of their images per unit length for each of the scanned straight areas of reduced strength, and determining a direction in which the scanned straight area of reduced strength, where the measured number of nodes is zero, extends as the machining feed direction.

It has been recognized that pulse energy is transmitted in part into underlying material areas during the initial laser damage. However, there are cases in which these areas must have no or only limited exposure to the laser radiation.

In particular, transmitted radiation energy may cause damage to electronic components due to the fact that primarily their metallic components absorb the majority of the laser radiation. This results in damage to the metallic structures themselves as well as to intermediate layers, for example in Schottky diodes, in which the intermediate layer of metal and semiconductors produces the desired diode effect. A change in the intermediate layer due to laser energy results in component failure.

This problem arises when the unneeded lower portion is to be separated from a so-called device wafer, i.e., a wafer with finished and semifinished electronic component structures. For one thing, this saves on grinding costs, which from an economic standpoint is very relevant, in particular for very hard materials such as SiC.

SUMMARY

An object of the present invention, therefore, is to provide a method that allows the production of a very thin composite structure by splitting off SiC solid body portions or a solid body layer, in particular an SiC layer, from the composite structure, wherein the composite structure is to have at least one metal layer and/or electrical components.

A method according to the invention preferably includes at least the steps: providing or producing the composite structure, wherein the composite structure has a solid body and at least one metallic coating and/or electrical components situated or provided on one side of the solid body, and on the other side forms a flat surface, wherein the solid body preferably contains or is made of silicon carbide (SiC); producing modifications in the interior of the solid body, wherein laser radiation is introduced into the solid body via the flat surface, wherein the laser radiation causes multiphoton excitation, wherein the multiphoton excitation brings about plasma generation, wherein the modification is effected by the plasma in the form of a material transformation, wherein the material transformations generate compressive stresses in the solid body, wherein the solid body develops subcritical cracks in a surrounding area of the particular modification. The modifications are preferably produced at a distance of less than 150 µm from the metallic coating and/or the electrical components. The laser radiation is preferably introduced into the solid body in pulses, wherein the pulse intensity of a pulse reaches the maximum pulse intensity particularly preferably within 10 ns, in particular within 8 ns or 6 ns or 5 ns or 4 ns or 3 ns or 2 ns or 1.5 ns or 1 ns, after the start of the particular pulse. The start of the pulse is defined as the exceedance of 1% of the highest pulse intensity. The end of the pulse is preferably defined as falling to below less than 1% of the highest pulse intensity, provided that the maximum pulse intensity was reached after the start of the pulse and before falling to below less than 1% of the highest pulse intensity. The pulse duration is thus the time between the pulse start and the pulse end.

This approach is advantageous due to the fact that for a high intensity the plasma generation starts quickly, as a result of which the transmission of the laser radiation to the metal layer or to the electrical components is limited or prevented. Thus, less radiation, and therefore less energy, reaches the metal layer or the electrical components, so that damage to the metallic coating and/or the electrical components is avoided, even for a distance of less than 150 µm from the metallic coating and/or the electrical components.

The approach is also advantageous due to the fact that for the first time, a very precise energy distribution over an individual laser pulse is specified.

Another advantage of the present approach is that, due to the crack-based separation of the solid body portion, it may be used once again as a device wafer. This results in significant productivity gains. On the one hand, much less tool wear is caused, compared to a reduction in thickness by grinding. On the other hand, the solid body portion to be separated is not converted into fragments, and instead may likewise be used as a solid body layer or wafer.

The metal layer may have an essentially or completely full-surface design, and may also be designed as metallic strip conductors having a thickness of a few µm, in particular 1 µm to 100 µm, in particular 1 µm to 10 µm, to a few nm, in particular 1 nm to 100 nm, in particular 1 nm to 10 nm.

Basically, in the laser treatment of the solid body according to the invention, bundling of the light in a focus is effected, thus creating free charge carriers by means of multiphoton absorption. This results in a release of electrons, which represent free charge carriers. The free charge carriers already present thus absorb more laser energy, and the energy is delivered to the solid body material, so that in turn, more electrons are released with the continuation of multiphoton absorption at the same time. This results in an avalanche of rapidly increasing electron density, as the result of which an electron plasma is ignited, which in turn creates a high temperature that brings about a phase transformation of SiC into amorphous components. SiC is thus converted into Si and C. In this regard, it is essential that the transmission of the laser radiation is very greatly suppressed after ignition of the electron plasma. This takes place by absorption of the free electrons in the plasma and/or by reflection and scattering of the radiation by the plasma.

The ignition of the plasma involves a swelling process, in which for starting the electron avalanche, a critical intensity for a multiphoton process must be reached, and an energy that is greater than a swelling energy must then be deposited at the focus point before the electron avalanche results in ignition of the plasma. Therefore, as a result of the approach according to the invention, the laser pulse has a very steep initial edge, so that the intensity threshold is exceeded, and the plasma ignites, as quickly as possible.

"Subcritical" means that the crack propagation ceases or stops before the crack divides the solid body into at least two parts. A subcritical crack preferably propagates less than 5 mm, in particular less than 1 mm or less than 500 µm or less than 250 µm or less than 100 µm, in the solid body. The modifications are preferably produced in such a way that upon separation from flat solid body plates, for example, the subcritical cracks preferably propagate predominantly in the same plane, in particular in a plane that is oriented in parallel or in a defined manner with respect to the surface of the solid body through which the laser beams penetrate into the solid body. The modifications are preferably produced in such a way that upon separation from uneven solid bodies, for example, the subcritical cracks preferably propagate in a defined manner, for example in a spherical ply or layer, in such a way that the separation area takes on a defined, in particular spherical, shape.

Further preferred embodiments are the subject matter of the subclaims and the following portions of the description.

According to one preferred embodiment of the present invention, each pulse introduces an energy E into the solid body, wherein as a result of the plasma generation and/or microcracks already produced, 20% maximum, in particular 15% maximum or 10% maximum or 5% maximum or 1% maximum or 0.5% maximum, of the energy E of the particular pulse is transmitted through the solid body up to the metallic coating and/or the electrical components. This embodiment is advantageous due to the fact that a limitation of the maximum energy input per pulse takes place on the metal layer or metallic structure or electrical components, thus preventing damage to the metal layer or metallic structure or electrical components due to the transmission of the laser radiation. The electrical component may be a Schottky diode, for example, and the composite structure may have a plurality of Schottky diodes or components or portions thereof.

According to another preferred embodiment of the present invention, the plasma for each pulse is generated within a time x after the start of the pulse. x is preferably shorter than the pulse duration y. x is particularly less than 10 ns, in particular less than 7.5 ns or less than 5 ns or less than 3 ns or less than 2 ns or less than 1 ns or less than 0.75 ns or less than 0.5 ns. Additionally or alternatively, $x<0.5*y$, in particular $x<0.2*y$ or $x<0.1*y$ or $x<0.05*y$ or $x<0.01*y$, may apply. This embodiment is advantageous due to the fact that the early generation of the plasma results in protection of the metal layer or metallic structure or electrical components.

According to another preferred embodiment of the present invention, the beam quality ($M^2$) is less than 1.4, in particular less than 1.3 or less than 1.2 or less than 1.1. This embodiment is likewise advantageous due to the fact that the multiphoton excitation, and thus the plasma generation, is very precisely controllable.

According to another preferred embodiment of the present invention, the laser radiation is generated with a pulse duration of less than 9 ns, in particular less than 8 ns or less than 7 ns or less than 6 ns or less than 5 ns or less than 4 ns or less than 3 ns or less than 2 ns or less than 1.8 ns or less than 1.6 ns or less than 1.4 ns or less than 1.1 ns or less than 0.9 ns or less than 0.75 ns or less than 0.6 ns or less than 0.5 ns or less than 0.4 ns.

According to another preferred embodiment of the present invention, for a pulse duration between 0.9 ns and 10 ns a surface energy of 10-200 nJ/µm² is provided, or for a pulse duration between 10 ps and 1.1 ns a surface energy of 0.1-50 nJ/µm² is provided, or for a pulse duration between 100 fs and 11 ps a surface energy of 0.01-0.1 nJ/µm² is provided.

According to another preferred embodiment of the present invention, the radiation intensity of a pulse after reaching the maximum has a minimum duration of 10 ps, in particular at least 50 ps or at least 100 ps or 500 ps or 1 ns, in particular for generating a thermal process, and has a maximum duration of 25 ns, in particular 15 ns or 10 ns or 7.5 ns or 5 ns or 3.5 ns or 2.5 ns or 2 ns, over 50% of the radiation intensity. This embodiment is advantageous due to the fact that there is sufficient time for thermal treatment, in particular for producing the modification.

According to another preferred embodiment of the present invention, the laser radiation is polarized in a defined manner, in particular linearly polarized. The polarization direction of the laser radiation is preferably oriented at a defined angle, in particular a fixed angle of 0° or 90°, or a defined angular range, in particular −20° to 20° or −10° to 10° or −5° to 5° or −1° to 1° or 70° to 110° or 80° to 100° or 85° to 95° or 89° to 91°, or at an angle<30° or at an angle<20° or at an angle<15° or at an angle<10° or at an angle<5°, with respect to the crystal axis of the solid body.

During polarization of the laser in parallel to the main plane, for laser machining into the C side of the SiC substrate it was determined that approximately 50% more laser energy is necessary to provide comparable damage patterns, compared to a laser polarization perpendicular to the main flat in this configuration. When circularly polarized light is used, for a polarizer opposite the direct polarization, ⅓ less transmitted laser power is measured. This means that for circularly polarized light, the utilized laser energy apparently must be increased by up to 50% compared to the linear ideal polarization. However, this difference may be even lower, in particular due to the nonlinearity of the process and the effective cross sections for multiphoton effects in SiC for circularly polarized light. A value between the swelling energies for ideal laser polarization and laser polarization that is rotated by 90° with respect to same is thus also possible, since both polarizations are transiently swept through in the course of the rotating laser polarization. However, multiphoton effects usually have better effective cross sections for linearly polarized light, so that even higher energies must be expended for perfect circularly polarized light.

According to another preferred embodiment of the present invention, the laser radiation is linearly polarized or elliptically polarized or circularly polarized. This embodiment is advantageous due to the fact that modifications may be produced by a defined polarization of the laser radiation, which makes a very short crack propagation of the subcritical cracks, in particular shorter than 100 μm, possible.

The direction of longitudinal extension of the modifications produced in the interior of the solid body by means of the laser beams is oriented at a defined angle, in particular a fixed angle of 0° or 90°, or a defined angular range, in particular −20° to 20° or −10° to 10° or −5° to 5° or −1° to 1° or 70° to 110° or 80° to 100° or 85° to 95° or 89° to 91°, with respect to an intersection line that results at the in particular imaginary or virtual interface between a plane on which the modifications are produced (generation plane) and an in particular imaginary or virtual intersection line that results in a crystal lattice plane.

The average crack length is preferably determined in one plane; i.e., the crack propagation in the orthogonal direction with respect to the direction of longitudinal extension of the linear shape is detected in the same plane, on one side and on the other side of the linear shape, and preferably evaluated or determined, with resolution for modifications.

The solid body may contain silicon carbide or be made of silicon carbide, in particular doped silicon carbide.

According to another preferred embodiment of the present invention, the laser radiation is introduced into the solid body via at least one optical element, wherein the optical element, in particular a lens, has a numerical aperture (NA) greater than 0.4, in particular greater than 0.5 or 0.6 or 0.7 or 0.8 or 0.9. Additionally or alternatively, prior to penetration into the solid body the laser radiation may preferably be led through an immersion fluid, in particular an immersion solution, wherein the NA when an immersion fluid is used is preferably greater than 1, in particular greater than 1.1 or 1.2 or 1.3, and is preferably up to 2.

According to another preferred embodiment of the present invention, the individual modifications have a maximum extension in the longitudinal direction (Z) of the solid body, wherein the maximum extension of the modifications is in each case preferably less than 100 μm, in particular less than 80 μm or less than 70 μm or less than 60 μm or less than 50 μm or less than 40 μm or less than 30 μm or less than 20 μm or less than 15 μm or less than 10 μm or less than 8 μm or less than 6 μm or less than 5 μm or less than 4 μm or less than 3 μm or less than 2 μm or less than 1 μm or less than 0.5 μm. In the direction of extension of the solid body, the first surface, via which the laser beams penetrate into the solid body, and the second surface of the solid body, at which the metal layer/s and/or the electrical components are situated or provided, are spaced apart from one another.

According to another preferred embodiment of the present invention, a plurality of modifications is produced to form a linear shape or multiple linear shapes, in particular a scribe line or multiple scribe lines. The subcritical cracks have an average crack length of less than 150 μm, in particular less than 120 μm or less than 110 μm or less than 90 μm or less than 75 μm or less than 60 μm or less than 50 μm or less than 40 μm or less than 30 μm or less than 25 μm, orthogonal to the direction of longitudinal extension of the particular linear shape.

According to another preferred embodiment of the present invention, modifications that are included in the same linear shape and produced in succession are produced at a distance from one another that is defined by the function $(d-x)/d<-0.31$, in particular $<-0.4$, where $x>d$. This approach is advantageous due to the fact that the stated condition $(d-x)/d<-0.31$ defines that the focus points of the successively produced modifications of the same linear shape are spaced far enough apart from one another that the previously produced material transformation results in little or no effects, in particular little or no increased absorption, in the subsequent material transformation. This is advantageous due to the fact that the modifications may thus be produced very precisely, as the result of which the tendency of subcritical cracks to propagate more intensely may be better controlled.

According to another preferred embodiment of the present invention, the distance in each case between two directly adjacent linear shapes is less than 400 μm, in particular less than 300 μm or less than 250 μm or less than 200 μm or less than 150 μm or less than 100 μm or less than 75 μm or less than 50 μm or less than 40 μm or less than 30 μm or less than 25 μm or less than 20 μm or less than 15 μm or less than 10 μm.

This embodiment is advantageous due to the fact that a crack front is created which imparts a characteristic shape to the exposed surface of the remaining solid body and to the exposed surface of the separated solid body layer. This characteristic shape preferably forms zigzag-shaped elevations and/or valleys on the side of the solid body layer and/or on the side of the remaining solid body. This applies for all solid bodies whose crystal planes and/or slip planes, i.e., preferred crack planes, are inclined with respect to the first surface through which the laser radiation is introduced into the solid body.

According to another preferred embodiment of the present invention, the modifications produced in the solid body are generated for a first part during a first relative movement of the solid body with respect to an optical system of the laser, and for a second part are generated during a second relative movement of the solid body with respect to the optical system of the laser. The first relative movement is preferably a linear movement in a first direction, and the second relative movement is preferably a linear movement in a second direction, the travel paths preferably being in parallel to one another. The entire travel path preferably forms a meandering shape, or a traversing movement brought about by an X-Y table.

According to another preferred embodiment of the present invention, a diffractive optical element (DOE) is situated in the path of the laser radiation upstream from the penetration of the laser radiation into the donor substrate or into the solid body. The laser radiation is divided over multiple light paths by the DOE in order to produce multiple focuses. The DOE creates an image field curvature that is less than or equal to 50 µm, in particular less than or equal to 30 µm or less than or equal to 10 µm or less than or equal to 5 µm or less than or equal to 3 µm, preferably over a length of 200 µm, wherein the DOE simultaneously generates at least 2, and preferably at least or exactly 3 or at least or exactly 4 or at least or exactly 5 or at least or exactly or up to 10 or at least or exactly or up to 20 or at least or exactly or up to 50 or up to 100 focuses for changing the material properties of the donor substrate. This embodiment is embodiment is advantageous due to the fact that the process can be significantly speeded up.

Thus, within the scope of the present invention it was recognized that high power levels with diffractive optical elements (DOEs) are divided over multiple focuses in the focal plane. DOEs show interference phenomena even in front of the focal plane, and it was recognized that interferences at the surface, in front of the focal plane, may produce localized intensity maxima that can result in damage to the surface as well as reduced transmissivity for laser radiation for machining in depth. In addition, it was recognized that some materials, such as SiC, have localized differences in the index of refraction and other material properties (such as absorption, transmission, scattering) due to the material doping, for example (frequent occurrence of doping spots). Furthermore, it was recognized that the wavefront of the laser in the depth of the material may be significantly impaired, depending on the surface roughness of the material at the laser coupling surface, so that the focus has reduced intensity (lower multiphoton transition probability), which once again would involve higher intensities with the above-stated problems.

Irradiation of the laser beams onto or into the solid body or the donor substrate at the Brewster angle is complicated and potentially demanding, since the various beam components travel over paths of different lengths in the highly refractive medium. The focus must therefore be adapted by higher energy and/or by beam forming. Beam forming preferably takes place, for example, via one or more diffractive optical elements (DOEs), which balances out this difference over the laser beam profile. The Brewster angle is relatively large, which for a large numerical aperture imposes requirements on the optical system and its dimensions, as well as the working distance. However, this approach is still advantageous, since reduced reflections at the surface also contribute to reduced surface damage due to the fact that there is better coupling of the light intensity into the material. Within the meaning of the present invention, laser beams may also be irradiated at the Brewster angle or essentially at the Brewster angle in all other embodiments disclosed in this document. With regard to Brewster angle coupling, reference is hereby made to the document "Optical Properties of Spin-Coated TiO2 Antireflection Films on Textured Single-Crystalline Silicon Substrates" (Hindawi Publishing Corporation, International Journal of Photoenergy, Volume 2015, Article ID 147836, 8 pages, http://dx.doi.org/10.1155/2015/147836). This document is incorporated by reference in full regard to the subject matter of the present patent application. The cited, incorporated document discloses in particular calculations for the optimal irradiation angle for various materials, and thus, indices of refraction. The energy of the laser or of the laser treatment device is adapted not so much as a function of the material, but, rather, as a function of the possible transmission at a specific angle. Thus, if the optimal transmission is 93%, for example, these losses must be taken into account with respect to tests with perpendicular irradiation and losses which are then 17%, for example, and the laser power must be adjusted accordingly.

Example

83% perpendicular transmission versus 93% transmission at an angle means that to achieve the same energy in depth, only 89% of the laser power that is used for perpendicular irradiation is required (0.83/0.93=0.89). Within the meaning of the invention, the portion of the oblique irradiation thus preferably results in less loss of light by surface reflection, and introduction of more light into the depth. One possible secondary problem that may arise in certain configurations is that the focus in depth may acquire a "skewed" profile, and therefore the achieved intensities—the key variable for multiphoton machining—are lower, possibly even lower than with perpendicular irradiation, in which all beam components travel through the same optical path in the material. This may preferably occur as the result of a diffractive optical element or by multiple diffractive elements, or a continuous wedge or multiple continuous wedges, and/or other optical elements, in the beam path which compensate for these additional paths and/or the influence on the individual beams, in particular different spherical aberrations over the beam profile. These DOEs can make numerical calculations, using suitable software solutions (for example, Virtuallab from Lighttrans, Jena) and then finish or provide the material.

According to another preferred embodiment of the present invention, the following parameters are set: NA>0.6, increase in intensity from 1% to maximum intensity of the pulse faster than 10 ns, distance between two linear shapes less than 100 µm, beam quality less than 1.4, depth of damage (distance to the metal layer or metallic structure or electrical components) less than 115 µm, point-to-point distance between two adjacent modifications=5 µm, 1064 nm laser, pulse energy between 5 and 20 µjoule/pulse, and doping between 10 and 50 milliohm/cm. It has been shown that this setting for SiC gives very advantageous results.

The above-stated object is also achieved according to the invention by a method for producing microcracks in the interior of a composite structure according to Claim 14. This method preferably includes at least the steps: Providing the composite structure, wherein the composite structure has a solid body and at least one metallic coating and/or electrical components situated or provided on one side of the solid body, and on the other side forms a flat surface, wherein the solid body contains or is made of silicon carbide (SiC);

producing modifications in the interior of the solid body, wherein laser radiation is introduced into the solid body via the flat surface, wherein the laser radiation causes multiphoton excitation, wherein the multiphoton excitation brings about plasma generation, wherein the modification is effected by the plasma in the form of a material transformation, wherein the material transformations generate compressive stresses in the solid body, wherein the solid body develops subcritical cracks in a surrounding area of the particular modification, wherein the modifications are produced at a distance of less than 150 µm from the metallic coating and/or the electrical components, wherein the laser radiation is introduced into the solid body in pulses.

Each laser pulse coupled into the solid body preferably introduces an energy E into the solid body, wherein as a result of the plasma generation and/or microcracks already produced, 20% maximum, in particular 15% maximum or 10% maximum or 5% maximum or 1% maximum or 0.5% maximum, of the energy E of the particular pulse is transmitted through the solid body up to the metallic coating and/or the electrical components.

Additionally or alternatively, the invention may relate to a method for producing microcracks in the interior of a composite structure. This method preferably includes at least the following steps: Providing the composite structure, wherein the composite structure has a solid body and at least one metallic coating and/or electrical components situated or provided on one side of the solid body, and on the other side forms a flat surface. The preferably flat surface or the surface via which the laser radiation penetrates into the solid body is preferably regarded as a first surface or main surface. The surface that is situated at a distance from and preferably parallel to the first surface, and on which the metal layer/s and/or electrical components are situated or produced, is preferably referred to as the second surface. The solid body contains or is made of silicon carbide (SiC). Producing modifications in the interior of the solid body, wherein laser radiation is introduced into the solid body via the flat surface, wherein the laser radiation causes multiphoton excitation, wherein the multiphoton excitation brings about plasma generation, wherein the modification is effected by the plasma in the form of a material transformation, wherein the material transformations generate compressive stresses in the solid body, wherein the solid body develops subcritical cracks in a surrounding area of the particular modification, wherein the modifications are produced at a distance of less than 150 µm from the metallic coating and/or the electrical components.

The laser radiation is preferably introduced into the solid body in pulses. The plasma for each pulse is preferably generated within a time x after the start of the pulse. x is preferably shorter than the pulse duration y. x is particularly preferably less than 10 ns, in particular less than 5 ns or less than 3 ns or less than 2 ns or less than 1.5 ns or less than 1 ns or less than 0.8 ns or less than 0.5 ns. In addition, $x<0.5*y$, in particular $x<0.2*y$ or $x<0.1*y$ or $x<0.05*y$ or $x<0.01*y$, preferably applies.

The present invention further relates to a method for separating at least one solid body layer from a composite structure. The method preferably includes at least the steps: Carrying out a method according to the invention for producing microcracks in the interior of a composite structure, and introducing an external force into the composite structure, in particular into the solid body, for producing stresses in the solid body, and/or generating an internal force in the solid body, the external and/or internal force being strong enough that crack propagation or joining of the subcritical cracks results along the separation area.

The present invention further relates to a method for producing at least one solid body layer, in particular for separating at least one solid body layer from a solid body. The method preferably includes at least the steps: Carrying out a method described herein, in particular a method for producing microcracks in the interior of a composite structure; introducing an external force into the solid body for producing stresses in the solid body, and/or generating an internal force in the solid body, the external and/or internal force being strong enough that crack propagation or joining of the subcritical cracks results along the separation area.

According to another preferred embodiment of the present invention, for introducing the external force a receiving layer is provided at an exposed surface of the solid body layer to be separated, wherein the receiving layer includes a polymer material, in particular PDMS, and for generating in particular mechanical stresses in the solid body, the receiving layer is subjected to thermal effects, wherein the thermal effect represents cooling of the receiving layer to a temperature below the ambient temperature, in particular to a temperature below 0° or to a temperature below −10° or to a temperature between −20° and −200° C., wherein the cooling takes place in such a way that the polymer material of the receiving layer undergoes a glass transition, and wherein as a result of the stresses a crack propagates in the solid body, along the separation area that separates the first solid body layer from the solid body, and/or for introducing the external force the solid body is acted on by sound, in particular ultrasound, and/or for introducing the external force the circumferential surface of the solid body is subjected to thermal effects and/or machining at the level of the separation plane, and/or for producing internal forces a number of modifications that cause the subcritical cracks to join into a single crack that separates the solid body layer are produced in the interior of the solid body.

The present invention further relates to a solid body layer, in particular produced by a method according to the invention described herein. The solid body layer or the wafer preferably contains or is made of SiC. The solid body layer preferably forms a surface, wherein the surface forms a topography, wherein the topography has elongated zigzag-shaped or wave-like elevations, wherein the elongated zigzag-shaped or wave-like elevations extend predominantly, in each case in their entirety, in a direction or multiple directions that is/are different from a direction that is parallel to the crystal lattice planes and parallel to the surface, in particular inclined with respect to same at an angle between 2° and 30°, in particular between 3° and 15°, in particular between 4° and 9°, wherein the average height of the zigzag-shaped or wave-like elevations or the maximum height of the zigzag-shaped or wave-like elevations with respect to the deepest location on the surface is less than 100 µm, in particular less than 75 µm or less than 50 µm or less than 30 µm. The deepest location is preferably considered to be only a location that is situated at a distance of at least 1 mm or at least 5 mm or at least 10 mm from the edge of the solid body layer or from the wafer. The solid body layer is preferably a wafer that is separated from an SiC ingot or SiC boule, or a thinned composite structure, wherein an SiC solid body portion of the composite structure has been split, divided, or separated, or is a solid body layer that is separated from a composite structure, wherein an SiC solid body portion of the composite structure has been split, divided, or separated.

The composite structure has at least one solid body or one donor substrate, wherein the solid body or the donor substrate contains or is made of SiC. In addition, the composite structure has at least one metal layer and/or electrical components.

This approach is advantageous due to the fact that a composite structure and a solid body layer are produced whose surface structure reduces or prevents the uncontrolled propagation of cracks.

Additionally or alternatively, the above-stated object may be achieved by a method for producing modifications in the interior of a solid body, preferably including at least the following steps: Introducing laser radiation of a laser into the interior of the solid body via a first surface of the solid body, wherein the solid body forms a crystal structure and is preferably made of SiC, and the laser radiation produces modifications at predetermined locations on a generation plane in the interior of the solid body in order to specify a separation plane, wherein the laser radiation for each modification brings about the conditioning of a plasma for modifying the solid body, wherein the plasma is kept in existence for a modification production period, wherein starting at the beginning of a laser pulse and up to directly before the conditioning of the plasma, a transmission period is present in which the laser radiation at least partially passes through the solid body, wherein the conditioning of the plasma takes place within a plasma conditioning period, wherein the laser radiation acting on the plasma is at least predominantly and preferably completely absorbed and/or reflected and/or scattered by the plasma, wherein the total time comprising the modification production period, transmission period, and plasma conditioning period, in particular ignition and heating of the plasma, corresponds to at least 70% of a pulse duration of the laser radiation during the production of the modification, wherein the pulse duration is less than 100 ns, wherein the laser radiation generates a defined radiation intensity in the focus point, resulting in a defined electron density, wherein the electron density in the focus point within the modification production period exceeds a predefined threshold value, wherein the modification production period is shorter than 70 ns. The modification production period may preferably be shorter than 4 ns, in particular shorter than 3 ns or 2 ns or 1 ns.

BRIEF DESCRIPTION OF THE FIGURES

Further advantages, objectives, and characteristics of the present invention are explained based on the following description of the appended drawings illustrating examples of the separating method according to the invention. Components or elements which may preferably be used in the method according to the invention and/or which in the figures at least essentially match with regard to their function may be denoted by the same reference numerals; however, these components or elements do not necessarily have to be denoted by numbers or explained in all the figures.

In the figures:

FIGS. 2a-2e show various exemplary illustrations of different polarizations,

FIG. 5 shows another donor substrate with crystal lattice planes oriented at an angle unequal to 90° with respect to the longitudinal axis, and produced laser scribe lines, wherein the orientation of the laser scribe lines or the line-type shape is defined by means of planes, FIG. 6 shows that the modifications of a linear shape intersect a plurality of different crystal lattice planes, FIG. 8a shows an example of a crystal lattice having a slip plane 110 for Si, FIG. 8b shows an example of a crystal lattice having a slip plane 100 for Si, FIG. 8c shows an example of a crystal lattice having a slip plane 111 for Si.

FIGS. 10a-10c show optical means for changing the laser beam properties, FIG. 11 schematically shows the curve of the radiation intensity of a laser pulse as a function of time, FIG. 12 schematically shows the electron density in the focus during a laser pulse, and FIG. 13 schematically shows the curve of the radiation intensity of an ideal laser pulse, in particular a top head profile, as a function of time.

DETAILED DESCRIPTION

Figure 1B:
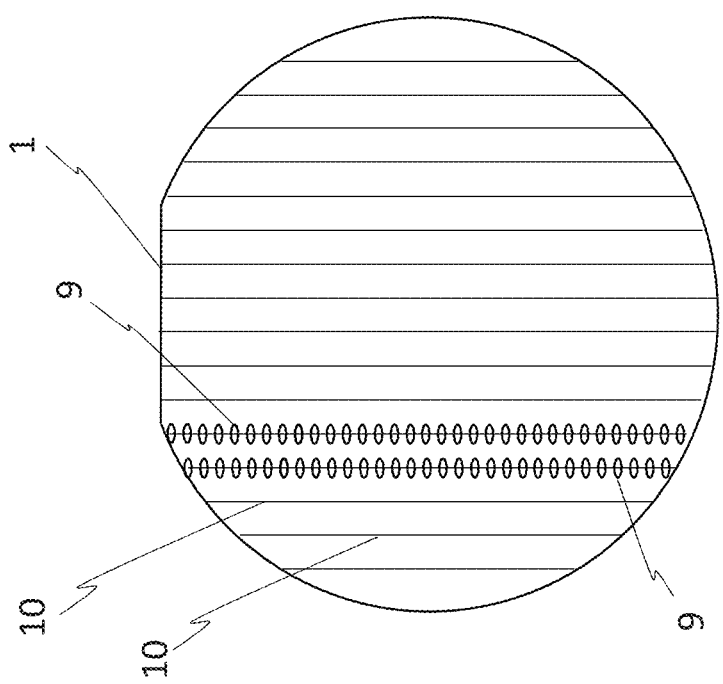
FIG. 1b shows a second schematic illustration of the relationship between a scribe line and polarized laser radiation.
Figure 1A:
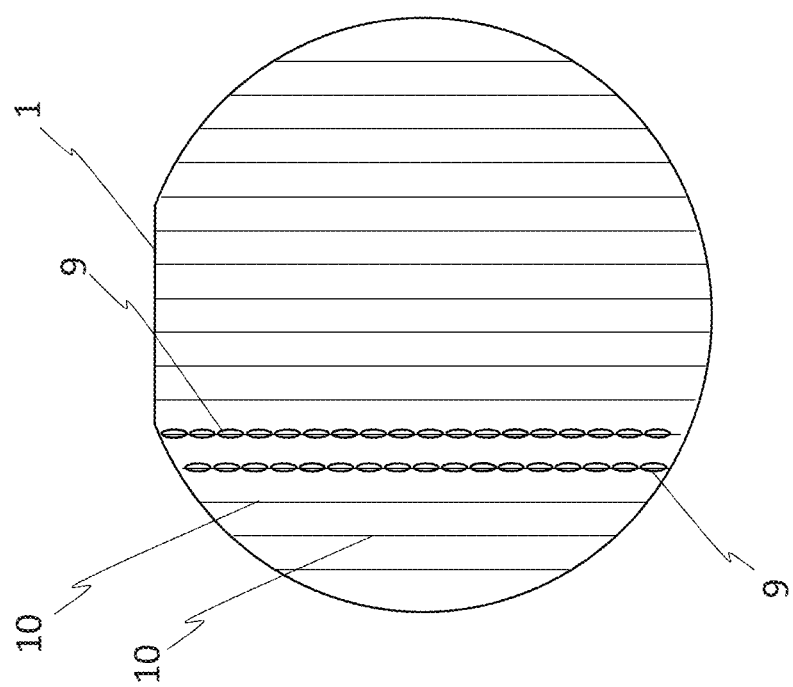
FIG. 1a shows a first schematic illustration of the relationship between a scribe line and polarized laser radiation.

FIG. 1a shows a schematic illustration of a solid body 1 during a treatment, in particular the production of modifications 9 in the interior of the solid body 1. The modifications 9 represent phase transformations of the solid body material, in particular SiC, produced by multiphoton excitation. According to this illustration, the modifications 9 are produced in such a way that they are spaced apart from one another. This approach is advantageous due to the fact that there is no, or only an insignificant, change in or influence on the absorption of the laser beams due to a modification 9 that is already produced. The modifications 9 are preferably produced in the form of linear shapes or scribe lines 103. The scribe lines 103 are preferably designed as a straight line. According to this illustration, the scribe lines 103 are preferably oriented in parallel to the intersection line 10. The intersection line 10 preferably results from an interface between the generation plane 4 and the crystal lattice plane 6 (see FIG. 4). According to this illustration, it is also apparent that the modifications 9 are always oriented in the same direction. As a result, the laser radiation is polarized in a defined manner. Thus, according to FIG. 1a a first polarization is used, while according to FIG. 1b a different polarization is used. Different damage patterns also preferably result from the different polarizations.

FIGS. 2a through 2e show several examples of differently polarized laser radiation. The example in FIG. 2a corresponds to the example from FIG. 1a, and the example in FIG. 2b corresponds to the example from FIG. 1b.

In addition, the polarization for multiple or all scribe lines 103 may be set to form a defined angle with respect to the direction of longitudinal extension of the scribe line 103. The angle may preferably be between 0° and 90°, in particular between 5° and 85°, in particular between 15° and 75°, in particular between 30° and 60°, in particular between 40° and 50°, or 45° or essentially 45°. This is shown by FIGS. 2c through 2e, for example.

FIG. 2d shows that the modifications 9 of different scribe lines 103 may be differently oriented. It is also possible for the modifications 9 of a scribe line, in portions or at points, to be differently polarized in a defined manner.

FIG. 2e shows a variant according to which more than 2, in particular 3 or more than 3, different polarized scribe lines 103 are produced.

It is also conceivable for the respective orientations R of individual or multiple modifications or of the majority of modifications of a linear shape to differ from one another. The respective orientations R of the modifications may differ from one another, in particular for curved or helical linear shapes. The orientation R of the modifications may therefore change continuously or in steps or in blocks, for example, wherein a block is preferably made up of multiple, in particular 2 to 200 or 2 to 100 or 2 to 50 modifications.

Figure 3B:
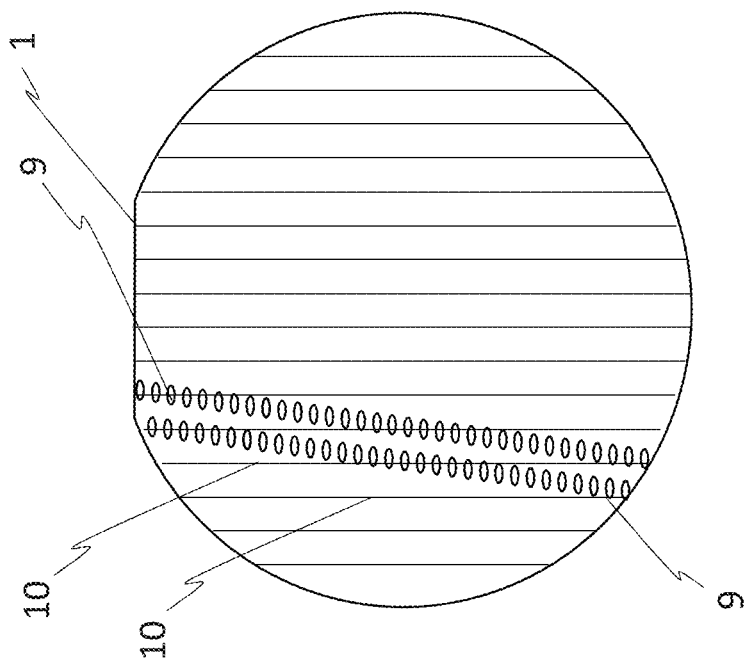
FIG. 3b shows a fourth schematic illustration of the relationship between a scribe line and polarized laser radiation.
Figure 3A:
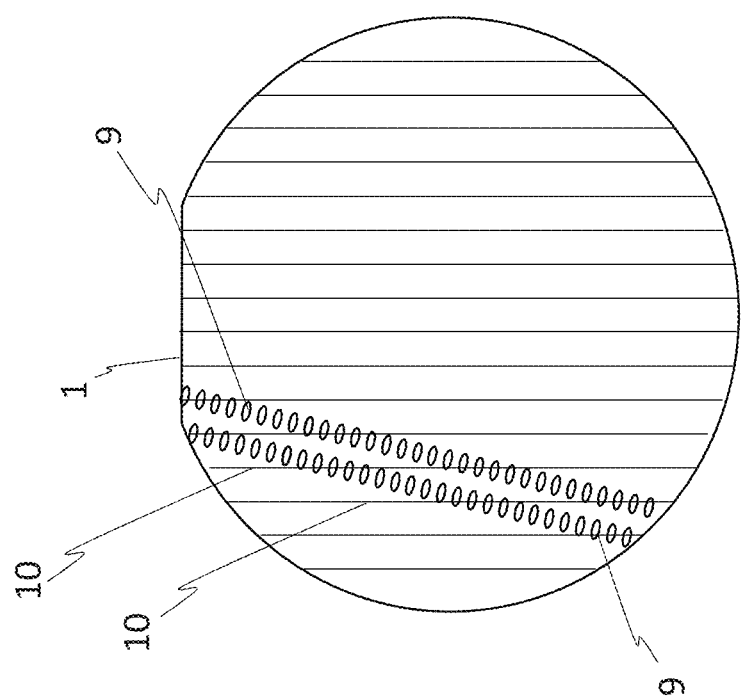
FIG. 3a shows a third schematic illustration of the relationship between a scribe line and polarized laser radiation.

FIG. 3a shows that the scribe lines may be inclined with respect to the intersection lines 10. Depending on the orientation of the polarization with respect to the scribe direction, the modifications 9 thus produced may have an orientation that is inclined with respect to the intersection line 10. FIG. 3b shows that the modifications may be produced in a 90° orientation with respect to the intersection line 10, while the scribe line is inclined with respect to the intersection line 10 or rotated in the plane.

Figure 4B:
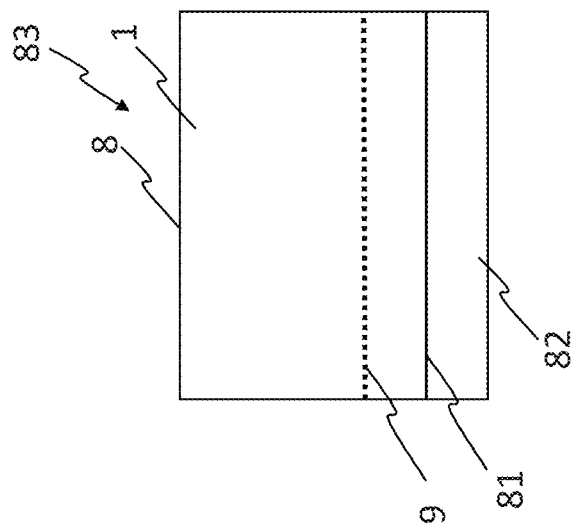
FIG. 4b shows the solid body known from FIG. 4a, supplemented by a metal layer and/or electrical components.
Figure 4A:
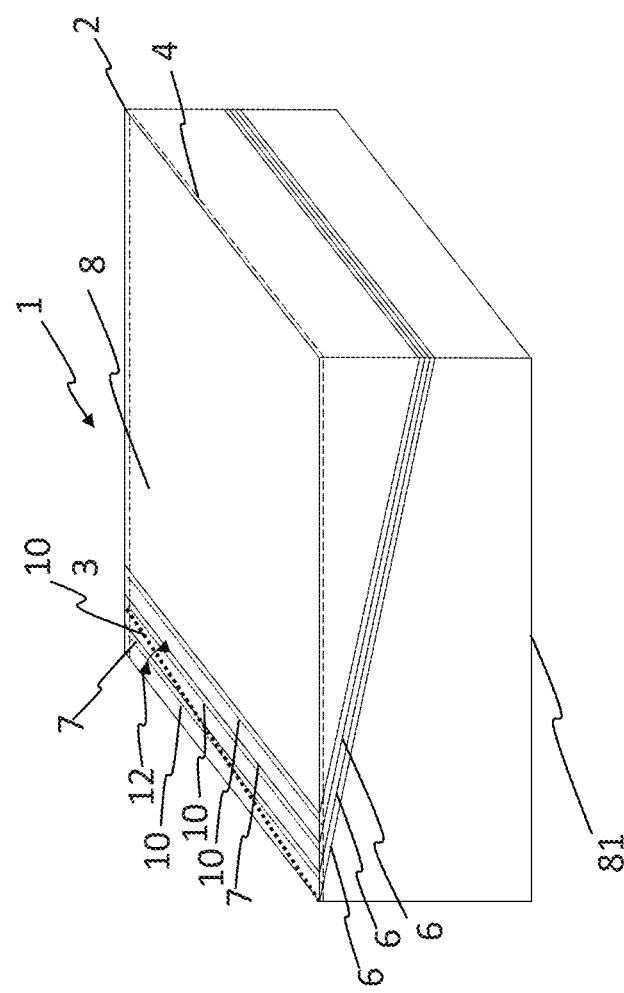
FIG. 4a shows a donor substrate with crystal lattice planes oriented at an angle unequal to 90° with respect to the longitudinal axis, and produced laser scribe lines.

FIG. 4a schematically shows that laser radiation 14 (see FIG. 10c) of a laser is introduced, via a main surface 8, into the interior of the solid body 1 in order to change the material properties of the solid body 1 in the area of at least one laser focus, wherein the laser focus is formed by laser beams emitted by the laser. The change in the material property forms a linear shape 103 by changing the penetration site of the laser radiation into the donor substrate 1, wherein the changes in the material property are produced on at least one, in particular the same, generation plane 4. The crystal lattice planes 6 of the donor substrate 1 are inclined in particular at an angle between 0.1° and 9°, preferably 2° or 4° or 8°, with respect to the generation plane 4. The linear shape 103 or scribe line is inclined with respect to an intersection line 10 that results at the interface between the generation plane 4 and the crystal lattice plane 6. As a result of the changed material property, the donor substrate 1 develops cracks in the form of subcritical cracks. A step of separating the solid body layer 2 by introducing an external force into the donor substrate 1 for joining the subcritical cracks is not illustrated. Alternatively, enough material on the generation plane 4 may be changed by means of the laser radiation that the solid body layer 2 separates form the donor substrate 1, with joining of the subcritical cracks. The generation plane 4 is preferably parallel to the main surface 8. The solid body or the donor substrate 1 or of the composite structure forms a second surface on the other side of the solid body or donor substrate 1 or the composite structure.

The machining takes place in the form of creation of linear shapes 103 or scribe lines or lines that are formed by applying individual laser shots at a defined spatial interval.

In particular, it is possible to produce a wafer made of silicon carbide, in particular of polytype 4H, having a 0001 surface with/without doping, with an off angle in the crystal axis of >0° (the industry standard is 4° or 8° about the direction of a main axis). Since the slip plane of the hexagonal crystal structure extends in parallel to the 0001 plane, a straight intersection line of the 0001 crystal plane with the wafer surface results, since the wafer surface latter is inclined relative thereto by the off angle.

Thus, the basic underlying concept of the novel method is that the machining direction of the laser lines 103 differs from the direction of these straight intersection lines. Likewise, the machining direction should preferably not extend along one of the main directions of the crystal or along the intersection lines of the preferred slip plane of the crystal with the surface of the crystal.

In addition, production of a wafer made of polytype 4H silicon carbide, for example, is possible. Polytype 4H silicon carbide has a hexagonal crystal system with a wurtzite structure and six-fold symmetry in the 0001 plane. Accordingly, a new main axis of the crystal is present every 60°. When the surface through which the machining laser penetrates into the material piece to be machined is cut along the 0001 plane, the six-fold symmetry is once again present upon rotation about the surface normal. A line scribe direction then results which is rotated by 30° with respect to the respective main axes, and thus oriented between two main axes. This ensures that the scribed line preferably intersects the unit cells of the crystal, and that formation of cracks that encompass fairly large areas and involve multiple unit cells all at once is more difficult. Polytype 4H silicon carbide is often cut at an off angle of 4° relative to the 0001 plane in order to simplify epitaxy steps in the subsequent machining. It is apparent that the projection of the main axes of the crystal with respect to one another is still virtually 60°, for which reason 30°±3° is the preferred scribe angle for the machining according to the invention.

In addition, it is possible to produce a wafer from cubic SiC (so-called 3C), for example. Cubic SiC has the behavior of cubic crystal systems, and thus has the 111 plane as the preferred slip plane, resulting in a preferred line scribe direction of 22.5°±3°.

It is also possible, for example, to produce a silicon wafer having a 100 surface, with/without doping, at an off angle of the crystal axis of 0°.

The preferred slip plane for silicon, with its cubic structure (diamond structure), is the 111 plane, which intersects the wafer surface at a 45° angle with respect to the crystal main axes. This results in a desired line scribe angle of 22.5°±3° with respect to the main axes of the crystal and of the intersection lines of the slip plane with the wafer surface, which are oriented at a 45° angle relative to one another.

Since silicon substrates may also be cut at an off angle, once again a different machining angle may be preferred here. When there is tilting about a main axis by an angle a, at the surface of the substrate the symmetry is broken from four-fold to two-fold symmetry due to the tilting. The projected length of the main axis, about which there is no tilting, is then scaled in proportion to cos (a), resulting in a change in the ideal angle between the main axes and the straight intersection line of the slip plane with the surface. The two line scribe angles b which are then possible due to the symmetry breaking are then either b1=tan−1 (cos a)/2 or b2=tan−1 (1/cos a)/2.

For gallium nitride, having a hexagonal wurtzite structure with six-fold crystal symmetry in the 0001 plane, whose preferred slip plane is the 0001 plane, the resulting angle of 60° for the main axes of the crystal results in a preferred line direction of 30°±3° with respect to the main axes.

For sapphire, i.e., aluminum oxide having a hexagonal corundum structure with six-fold crystal symmetry in the 0001 plane, the resulting angle of 60° for the main axes of the crystal results in a preferred line direction of 30°±3° with respect to the main axes for the so-called C-plane sapphire.

For A-plane cut sapphire, the main axis orientation is at a 90° angle with 180° symmetry, resulting in a preferred line scribe angle of 45°±3°.

C-plane substrates of sapphire are cut in such a way that the six-fold symmetry is apparent at the surface, and the surface coincides with the slip plane; i.e., an angle of 30°±3° is preferred.

For M-plane cut sapphire, the main axis orientation is at a 90° angle with 180° symmetry, resulting in a preferred line scribe angle of 45°±3°.

R-plane sapphire has no rotational symmetry, but has main axis projections at 45° with respect to the straight projection line of the slip plane, so that here as well, a 22.5°±3° scribe direction is preferred.

For lithium tantalate, having a triclinic structure that is related to the hexagonal crystal system, a scribe direction results that is between 10°±3° and 45°±3° relative to the individual main axes and their projection into the substrate surface, depending on the orientation of the substrate.

For gallium arsenide, having a sphalerite structure with four-fold crystal symmetry in the 100 plane, whose preferred slip plane is the 111 plane, the resulting angle of 90° for the main axes of the crystal results in a preferred line direction of 22.5°±3° with respect to the main axes of the substrate or donor substrate 1 with a 100 surface.

For gallium oxide, having a monoclinic cubic structure with four-fold crystal symmetry in the 100 plane, whose preferred slip plane is the 111 plane, the resulting angle of 90° for the main axes of the crystal results in a preferred line direction of 22.5°±3° with respect to the main axes of the substrate with a 100 surface.

For germanium, having a diamond structure with four-fold crystal symmetry in the 100 plane, whose preferred slip plane is the 111 plane, the resulting angle of 90° for the main axes of the crystal results in a preferred line direction of 22.5°±3° with respect to the main axes of the substrate with a 100 surface.

For indium phosphide, having a sphalerite structure with four-fold crystal symmetry in the 100 plane, whose preferred slip plane is the 111 plane, the resulting angle of 90° for the main axes of the crystal results in a preferred line direction of 22.5°±3° with respect to the main axes of the substrate with a 100 surface.

For yttrium-aluminum garnet, having a cubic structure with four-fold crystal symmetry in the 100 plane, whose preferred slip plane is the 111 plane, the resulting angle of 90° for the main axes of the crystal results in a preferred line direction of 22.5°±3° with respect to the main axes of the substrate with a 100 surface.

FIG. 4b shows that the modifications 9 are produced very near, in particular less than 150 μm from, the metal layer and/or the electrical components 82. The laser radiation is preferably introduced into the solid body 1 via the first surface 8. It is important that only a very small quantity of energy of the particular laser pulse reaches the metal layer or the electrical components. Due to the proximity of the modifications 9 to the metal layer 82, laser parameters are selected via which the plasma that is required for the material transformation is generated within a very short time. The plasma has the property of partially absorbing and partially reflecting the laser radiation, thereby significantly reducing the quantity of energy that is transmitted to the metal layer and/or the electrical components 82. The modifications 9 may thus be produced very close to the metal layer and/or the electrical components 82. Reference numeral 83 denotes the solid body 1 and metal layer/s and/or electrical components as a whole, which is referred to as a composite structure.

FIG. 5 shows an important step of the method according to the invention for separating at least one solid body layer 2 from a donor substrate 1, and a geometrical derivation of the orientation of the scribe line 103 or of the orientation of the linear shape.

According to the illustration, the method according to the invention may additionally or alternatively include the following steps:

Providing the donor substrate 1, wherein the donor substrate 1 has crystal lattice planes 6 that are inclined with respect to a flat main surface 8, wherein the main surface 8 delimits the donor substrate 1 on one side in the longitudinal direction L of the donor substrate 1, wherein a crystal lattice plane normal 60 is inclined in a first direction with respect to a main surface normal 80; providing at least one laser 29; introducing laser radiation 14 of the laser into the interior of the solid body or donor substrate 1 via the main surface 8 in order to change the material properties of the solid body in the area of at least one laser focus, wherein the laser focus is formed by laser beams emitted by the laser, wherein the change in the material property forms a linear shape by changing the penetration site of the laser radiation in the donor substrate 1, wherein the linear shape preferably extends in a straight line, at least in portions, and wherein the linear shape, in particular at least the portion extending in a straight line, is created in parallel to the main surface 8 and extends in a second direction that is inclined at an angle, different from 90°, with respect to the first direction, wherein the donor substrate 1 develops cracks in the form of subcritical cracks due to the changed material property; separating the solid body layer by introducing an external force into the donor substrate to join the subcritical cracks, or changing enough material on the generation plane by means of the laser radiation that the solid body layer separates from the donor substrate, with joining of the subcritical cracks. The main surface is preferably a component of the separated solid body layer 2.

The second direction is preferably inclined in an angular range between 45° and 87°, in particular in an angular range between 70° and 80° and preferably at 76°, with respect to the first direction.

FIG. 6 shows that the linear shape 103 or the scribe line is inclined with respect to the ends of the crystal lattice plane or, as shown in FIG. 5, with respect to an intersection line 10 or a straight intersection line that results at the interface between the generation plane 4 and the crystal lattice plane 6. As the result of this orientation, the crack growth is limited in the direction of the crystal lattice planes 6 (in particular slip planes). Thus, the modifications 9 for each scribe line are not produced in the same crystal lattice planes 6. For example, the first 1-5% of the modifications for each scribe line 103 may thus cut only a fraction, in particular less than 75% or less than 50% or less than 25% or less than 10% or none of the crystal lattice planes of the last 1-5% of the modifications of the same scribe line 103 in the substrate longitudinal direction L. This relationship is schematically depicted in particular in that the modification 9a cuts the crystal lattice planes 6a-6c, and the modification 9b cuts the crystal lattice planes 6a, 6d, and 6e. Thus, two modifications 9a and 9b, although they are components of the same linear shape 103 or scribe line, cut different crystal lattice planes. Furthermore, it is apparent that, for example, the modifications 9c and 9d preferably cut different, in particular predominantly or completely different, crystal lattice planes than does the modification 9a.

The ends 7 of the crystal lattice planes 6 that terminate on the main surface 8 preferably form a type of sawtooth pattern in a microscopic sectional illustration.

The individual crystal lattice planes 6 are preferably inclined at an angle between 0.1° and 10°, in particular between 2° and 9°, for example 4° or 8°, with respect to the longitudinal axis L. The individual crystal lattice planes of the donor substrate 1 are preferably oriented in parallel to one another.

Figure 7:
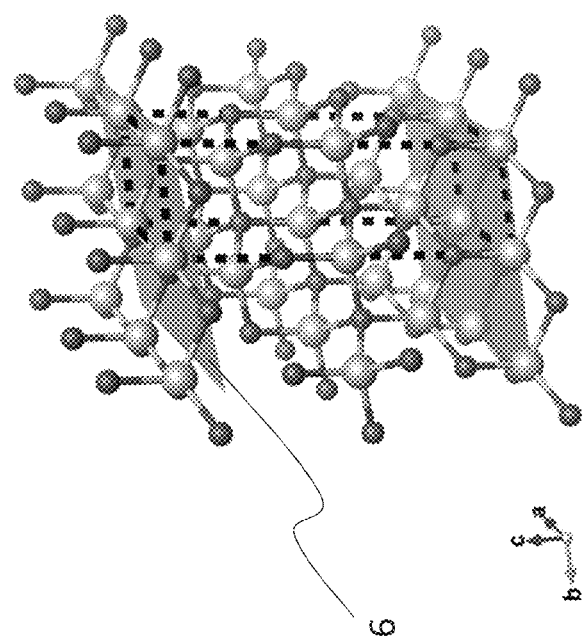
FIG. 7 shows an example of a crystal lattice having a slip plane for 4H—SiC.

FIG. 7 shows an example of a crystal lattice having a slip plane for 4H—SiC; FIG. 8a shows an example of a crystal lattice having a slip plane 110 for Si; FIG. 8b shows an example of a crystal lattice having a slip plane 100 for Si; and FIG. 8c shows an example of a crystal lattice having a slip plane 111 for Si.

The crystal lattice planes 6 are preferably slip planes of a specific type. If the crystal structure is face-centered cubic, the slip plane is preferably the plane {111} and the slip direction is the direction <110>. If the crystal structure is body-centered cubic, the slip plane is preferably the plane {110} and the slip direction is the direction <111>, or the slip plane is preferably the plane {112} and the slip direction is the direction <111>, or the slip plane is preferably the plane {123} and the slip direction is the direction <111>. If the crystal structure is hexagonal, the slip plane is preferably the plane {0001} and the slip direction is the direction <1120>, or the slip plane is preferably the plane {1010} and the slip direction is the direction <1120>, or the slip plane is preferably the plane {1011} and the slip direction is the direction <1120>.

Figure 9B:
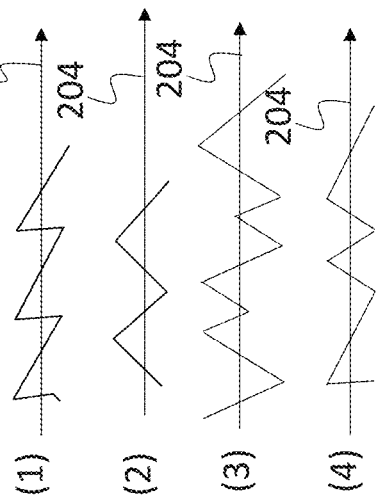
FIG. 9b shows a typical surface structure of a solid body surface of a solid body layer that is separated using the method according to the invention.
Figure 9D:
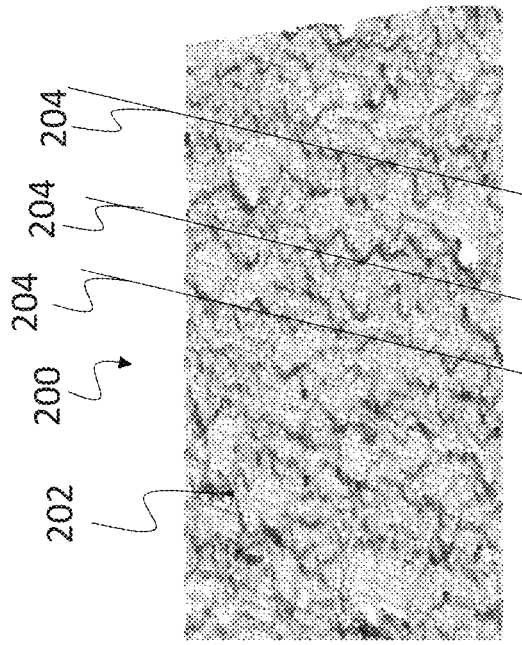
FIG. 9d shows various zigzag-shaped lines.
Figure 9A:
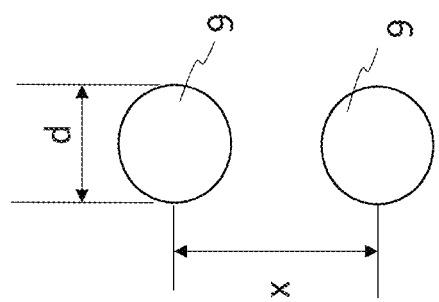
FIG. 9a shows a schematic illustration of the theoretical relationships of formula $(d-x)/x$.
Figure 9C:
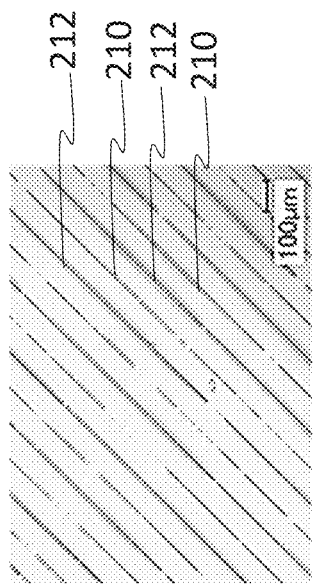
FIG. 9c shows an illustration of scribe lines produced as the result of differently defined parameters.

FIG. 9a shows the theoretical basis for the condition (d−x)/d<y, where y is preferably −0.31 or less than 0.31 or less than 0.35 or less than 0.4. In addition, the expression "d=1.22*lambda/NA−diffraction-limited focus size" preferably applies. x is preferably the distance between the points or the distance between the centers of two focus points produced in succession on a linear shape. In addition, x>d preferably applies. According to the invention, a numerical aperture is preferably used that is greater than 0.5 or greater than 0.6 or greater than 0.65 or greater than 0.7 or greater than 0.75 or greater than 0.8 or greater than 0.85.

FIG. 9b shows a surface 200, exposed in a separation step, of a solid body layer that is separated from a solid body. The surface 200 has a topography with elongated zigzag-shaped elevations. The elongated zigzag-shaped elevations extend predominantly, and in each case in their entirety, in a direction 204 or multiple directions 204 that is/are different from a direction that is parallel to the crystal lattice planes and parallel to the surface, in particular inclined at an angle relative thereto between 2° and 30°, in particular between 3° and 15°, in particular between 4° and 9. The average height of the zigzag-shaped elevations or the maximum height of the zigzag-shaped elevations, in particular with respect to the deepest location on the surface, is preferably less than 100 µm, in particular less than 75 µm or less than 50 µm or less than 30 µm.

Since the laser energy threshold for producing a uniform crack pattern or optical density, i.e., phase transformation/laser modification, at an angle of the scribed line with respect to the main flat that is not zero is a function of the traversal direction, it may be advantageous to adapt the laser energy to the particular machining direction. This is shown in FIG. 11c, where meandering travel is carried out for the machining, and every other line 210 (machining direction 1) has a different modification intensity than the respective adjacent lines 212 (machining direction 2). Accordingly, the weaker lines would be adapted to a correspondingly higher laser energy in order to provide a damage pattern that is as uniform as possible, and thus, to obtain an equal likelihood of crack formation in each line traverse.

FIG. 9d shows four different zigzag-shaped lines (1)-(4). These lines schematically specify examples [of shapes] that the elevations 202 or depressions may have. The elevations 202 or depressions may repeat uniformly or approximately uniformly section by section. Uniformly repeating zigzag patterns are shown by the patterns (1) and (2). The elevations and depressions preferably always have a first component that extends in a first direction, and a second component that extends in a second direction. These components preferably repeat along a direction 204, in particular along the scribe direction or along the direction in which the modifications of a linear shape are produced. However, it is also possible for the first component to extend for a longer or a shorter distance, compared to an average length, "for each zag" or for "individual zags." However, it is additionally or alternatively possible for the second component to extend for a longer or a shorter distance, compared to an average length, "for each zag" or for "individual zags." The first direction may preferably change, for each zag, in an angular range between 0° and 45°, in particular in an angular range between 0° and 20° or between 0° and 5°. Additionally or alternatively, the second direction may preferably change, for each zag, between 0° and 45°, in particular in an angular range between 0° and 20° or between 0° and 5°. Examples (3) and (4) show crack patterns with variable length components and angles.

FIG. 10a shows an incident light cone 5700 via which a focus 5700 [sic; 5701] is created in the solid body 1. The illustration shows a focus image of a lens that is irradiated by a laser having a Gaussian beam profile.

FIG. 10b schematically represents a focus image 5702 of a lens that is irradiated by a laser having a non-Gaussian beam profile, for example after the beam has been modified by an SLM. A spatial light modulator (SLM) is a spatial modulator for light, and thus, a device via which a spatial modulation may be applied to the light. The Z extension of the focus point is greatly reduced or reducible in comparison to the Gaussian beam profile.

FIG. 10c schematically represents a focus image 5703 of a lens that is irradiated by a laser having a non-Gaussian beam profile, for example after the beam has been modified by a diffractive optical element (DOE). The beam is preferably split by the DOE to form multiple focuses. A DOE is preferably used to diffract a laser beam in order to change the spatial imaging of the focus point.

Diffractive optical elements (DOEs) act by diffraction of laser radiation. Structures are used that are on the scale of the laser wavelength. By numerical simulation of the light diffraction on diffracting structures, an element is calculated, which may then be manufactured in large production volumes. In general, the spatial distribution of the light in the laser beam profile is altered, either directly downstream from the element, or in the focal point downstream from a focusing element. This means, for example, that a beam may be split into multiple beams, that a (typically occurring)

Gaussian beam intensity profile is converted into some other form, or that the intensity distribution of the laser radiation in the focus is modified in a manner that is not achievable with conventional lenses, for example by the intentional introduction or suppression of secondary maxima that are necessary for the desired laser interaction.

In contrast, a spatial light modulator (SLM) is a device for applying spatial modulation to light.

An SLM typically modulates the intensity of a light beam; however, it is also possible to modulate the phase, or also the phase and the intensity at the same time.

For the DOE, this spatial modulation is performed by the structures in the element, whereas for the SLM it is performed by the individual pixels on the SLM. In particular after imaging or focusing an intensity- and phase-modulated beam, programmable intensity distributions in the focus are thus achievable. Whereas a DOE thus acts statically and reproducibly on the laser beam, by use of an SLM, for example, the number of beams or also the laser beam profile used in a laser machining device may be dynamically switched. In addition, dynamic adaptation in the course of the process is possible, for example according to feedback from simultaneous monitoring of progress of the process.

According to the invention, the method proposed herein includes the step of altering a beam property of the laser beams before penetration into the solid body, wherein the beam property is the intensity distribution in the focus, wherein the change or adaptation of the beam property is brought about by at least one or exactly one spatial light modulator and/or by at least one or exactly one DOE, wherein the spatial light modulator and/or the DOE are/is situated in the beam path of the laser radiation, between the solid body and the radiation source.

For an explanation of the operating principle of DOEs and spatial light modulators, reference is made to the following publication: Flexible beam shaping system for the next generation of process development in laser micromachining, LANE 2016, 9th International Conference on Photonic Technologies, LANE 2016, Tobias Klerks, Stephan Eifel.

Laser beam intensity profiles that differ from the normal Gaussian shape are referred to as non-Gaussian beam profiles, and may be used to achieve some other machining result. Thus, for example, a line focus is conceivable that has a much different extension in a dimension perpendicular to the beam propagation direction than in a second dimension. This allows fairly broad areas of the workpiece to be swept over with the laser beam in the machining step. A "top hat" profile is also known which has a constant intensity in the center of the beam, which offers the advantage that in the machining, there are no areas of different intensity in the focus, or at least only areas with the same intensity lie above the laser machining threshold. This may be used, for example, to minimize the grinding losses after the separation.

The present invention thus preferably relates to a method for producing modifications 9 in the interior of a solid body 1. The method preferably includes the step of introducing laser radiation 14 of a laser 29 into the interior of the solid body 1 via a first surface 8 of the solid body 1. The surface 8 via which the laser radiation 14 penetrates into the solid body 1 is preferably a component of the solid body layer to be separated. The solid body layer to be separated is preferably thinner than the remaining solid body portion.

The solid body 1 preferably forms as a crystal structure, and due to the laser radiation 14, modifications 9 are produced at predetermined locations on a generation plane 4 in the interior of the solid body 1. The generation plane is preferably parallel to the first surface 8. The modifications 9 are preferably situated closer to the first surface 8 than to a second surface, the second surface preferably being provided in parallel to the first surface 8. As a result of the modifications 9, multiple linear shapes 103, in particular dotted or solid scribe lines, are produced, wherein the solid body 1 develops subcritical cracks in the area of the particular modification 9, wherein the subcritical cracks orthogonal to the direction of longitudinal extension of the particular linear shape have a crack length or average crack length of less than 150 µm, in particular less than 120 µm, or less than 110 µm or less than 90 µm or less than 75 µm or less than 60 µm.

"In the area" of the modification 9 may be understood to mean that the solid body 1 forms cracks in the modified or material-transformed portion, and in the adjoining portion of the solid body. However, it is also possible for the crack to form not in the modified area, but rather, above or below the modification/s in the longitudinal direction of the solid body. If the solid body develops cracks above or below the modification/s, the distance of the crack (in particular the subcritical crack) from the generation plane is preferably less than 20 µm, in particular less than 15 µm or less than 10 µm or less than 5 µm or less than 4 µm or less than 3 µm or less than 2 µm or less than 1 µm.

The modifications 9 that are included in the same linear shape 103 and produced in succession are preferably produced at a distance from one another that is defined by the function $(d-x)/d < -0.31$, in particular $< -0.4$.

Additionally or alternatively, the laser radiation may be polarized in a defined manner. The polarization direction of the laser radiation 14 is preferably oriented at a defined angle or in a defined angular range with respect to the crystal axis of the solid body 1, or the direction of longitudinal extension R of the modifications 9 produced in the interior of the solid body 1 by means of the laser beams 14 is oriented at a defined angle or in a defined angular range with respect to an intersection line 10 that results at the interface between the generation plane 4 and the crystal lattice plane.

FIG. 11 shows a radiation intensity distribution in the focus 400 as a function of time 401.

Reference numeral 402 denotes IMP, i.e., the radiation intensity in the focus at which the onset of the multiphoton process takes place. The onset of the multiphoton process is denoted by reference numeral 409. Reference numeral 410 denotes $t_{mp}$, i.e., the time after the pulse start 408 at which the onset of the multiphoton process takes place. The transmission period 403 is understood to mean the time beginning at the pulse start 408 up to the production of the modification. The transmission period 403 may encompass a plasma conditioning period.

Reference numeral 404 denotes $I_{BD}$, i.e., the radiation intensity in the focus at which an electron plasma breakdown takes place. That is, beginning at this moment the electron plasma is initiated. Reference numeral 405 denotes the energy for electron generation, the majority of which is transmitted. This represents a shortening of this time within the meaning of the present invention. Reference numeral 406 denotes $I_{ON}$, i.e., the radiation intensity in the focus at which a modification onset 413 takes place. That is, beginning at this moment a material transformation or phase transformation takes place. Similarly, reference numeral 412 denotes the time, after the pulse start 408, at which the modification onset takes place. Reference numeral 414 indicates the modification period, i.e., the period in which a material transformation takes place.

Reference numeral 416 denotes an electron plasma breakdown $I_{BD} < I_{ON}$, since absorption BD>absorption ON. The electron plasma breakdown results in a directly subsequent modification breakdown 418. Reference numeral 420 denotes the pulse end of the laser pulse.

This results in a method according to the invention. This method according to the invention is preferably used for producing modifications 9 in the interior of a solid body 1, and preferably includes at least the following steps: Introducing laser radiation 14 of a laser 29 into the interior of the solid body 1 via a first surface 8 of the solid body 1, wherein the solid body 1 forms a crystal structure, and wherein the laser radiation 14 produces modifications 9 at predetermined locations on a generation plane 4 in the interior of the solid body 1 in order to specify a separation plane, wherein the laser radiation for each modification brings about the conditioning of a plasma for modifying the solid body, wherein the plasma is kept in existence for a modification production period 414, wherein starting at the beginning of a laser pulse and up to directly before the conditioning of the plasma, a transmission period 403 is present in which the laser radiation at least partially passes through the solid body, wherein the conditioning of the plasma takes place within a plasma conditioning period 412, wherein the laser radiation acting on the plasma is at least predominantly and preferably completely absorbed and/or reflected and/or scattered by the plasma, wherein the total time comprising the modification production period 414, transmission period 403, and plasma conditioning period, in particular ignition and heating of the plasma, corresponds to at least 70% of a pulse duration of the laser radiation during the production of the modification, wherein the pulse duration is less than 100 ns, in particular less than 10 ns or less than 5 ns or less than 3 ns or less than 2 ns or less than 1 ns. The laser radiation generates a defined radiation intensity in the focus point, resulting in a defined electron density, wherein the electron density in the focus point within the modification production period exceeds a predefined threshold value, wherein the transmission period is shorter than 70 ns. The transmission period is particularly preferably shorter than 2 ns, in particular shorter than 1 ns or 0.75 ns or 0.5 ns.

Figure 12:
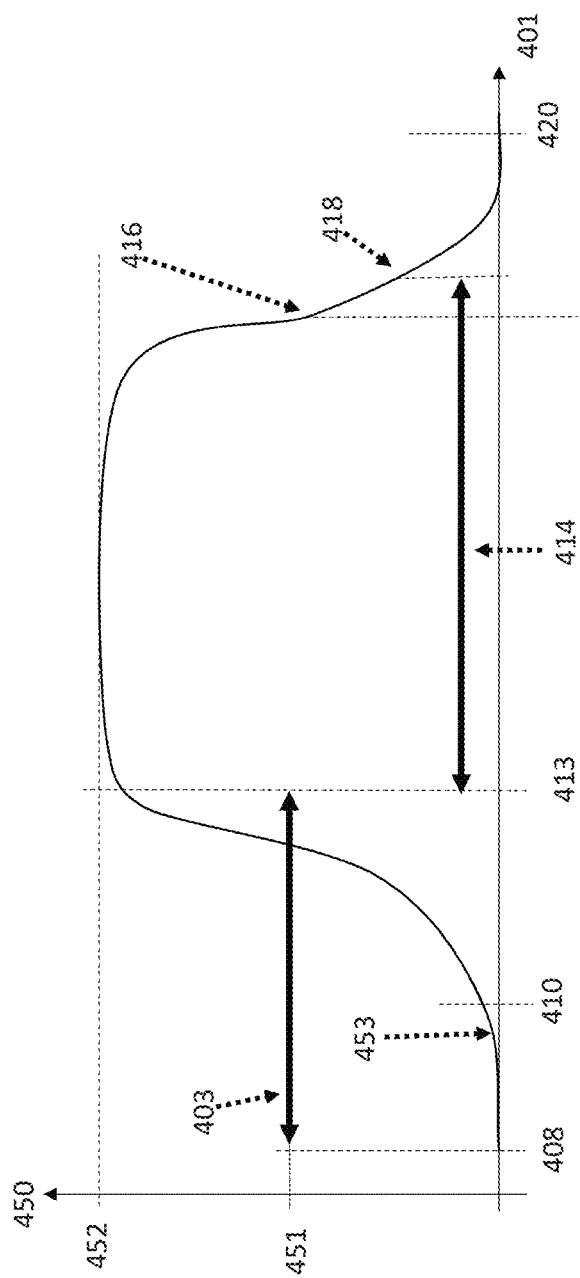

FIG. 12 shows a curve of the electron density 450 as a function of time 401. Reference numeral 451 denotes the point of plasma onset, i.e., the moment at which the plasma is formed and begins to absorb, reflect, and scatter laser radiation, i.e., the moment at which the plasma begins to reduce or prevent a transmission of the laser beams to the metal layer or metallic structure or the electrical components. Reference numeral [sic] denotes the maximum electron density. The electron plasma preferably oscillates with the laser radiation.

In the event that absorption nuclei are present, the electron density would increase more steeply after the pulse start, as a result of which the transmission period 403 would be shorter. For this case, reference numeral 453 denotes a linear absorption by amorphized crystal areas that are already present.

Thus, a further method for producing modifications 9 in the interior of a solid body 1 is possible. This further method preferably includes the steps of introducing laser radiation 14 of a laser 29 into the interior of the solid body 1 via a first surface 8 of the solid body 1. The solid body 1 preferably forms a crystal structure. The laser radiation 14 produces modifications 9 at predetermined locations on a generation plane 4 in the interior of the solid body 1. The second surface 81 is preferably provided parallel to the first surface 8. Multiple linear shapes 103, in particular scribe lines, are preferably produced by the modifications 9. The solid body 1 develops subcritical cracks, preferably in the area of the particular modification 9, wherein the subcritical cracks preferably have an average crack length of less than 150 µm, in particular less than 120 µm or less than 110 µm or less than 90 µm or less than 75 µm or less than 60 µm, orthogonal to the direction of longitudinal extension of the particular linear shape. The laser radiation is preferably polarized in a defined manner, in particular linearly polarized, wherein the polarization direction of the laser radiation 14 is particularly preferably oriented at a defined angle or in a defined angular range with respect to the crystal axis of the solid body 1. Additionally or alternatively, the direction of longitudinal extension R of the modifications 9 produced in the interior of the solid body 1 by means of the laser beams 14 is oriented at a defined angle or in a defined angular range with respect to an intersection line 10 that results at the interface between the generation plane 4 and the crystal lattice plane 6.

The laser radiation for each modification preferably brings about the conditioning of a plasma for modifying the solid body. The plasma is preferably kept in existence for a modification production period 414, wherein directly before the conditioning of the plasma and starting at the beginning of a laser pulse, a transmission period 403 is present in which the laser radiation at least partially passes through the solid body, wherein the conditioning of the plasma takes place within a plasma conditioning period, wherein the laser radiation acting on the plasma is at least predominantly and preferably completely absorbed and/or reflected and/or scattered by the plasma. The length of the plasma conditioning period is preferably between the transmission period and the modification period, and may be very small, in particular shorter than 1 ns or shorter than 0.1 ns or shorter than 0.01 ns. The total time comprising the modification production period 414, transmission period 403, and plasma conditioning period (not illustrated), in particular ignition and heating of the plasma, is preferably less than 10 ns, in particular less than 4 ns. The laser radiation thus preferably generates a defined radiation intensity in the focus point, resulting in a defined electron density, wherein the electron density in the focus point is large enough that the transmission period is particularly preferably shorter than the modification production period. Thus, during the modification production period the plasma brings about the phase transformation, in particular due to a thermal effect, in particular heating of the solid body material to a value at or above a phase transformation temperature.

Very precise setting of the laser pulse edges, i.e., the temporal range in which the laser pulse energy increases to its maximum or drops from the maximum to below a limit value, as well as setting of the individual laser intensity distribution over the curve of an individual laser pulse, preferably take place. For spectrally broadened pulses, an asymmetrical intensity distribution that deviates from the Gaussian profile is achievable, for example due to a so-called "chirp," an array of individual frequencies of the laser radiation that are offset in time.

Figure 13:
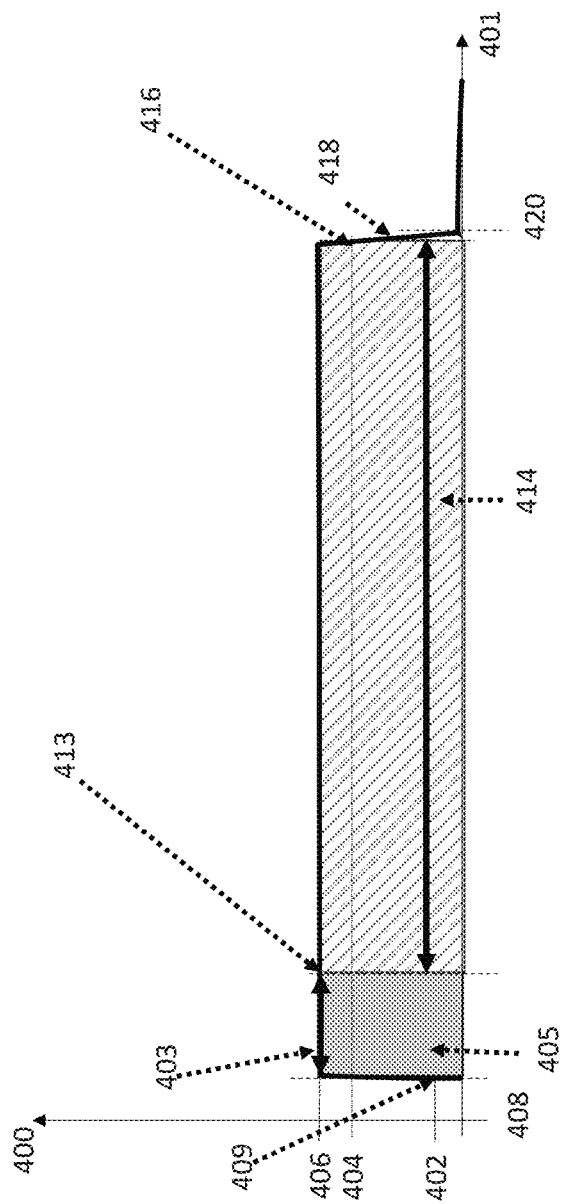

FIG. 13 shows such an alternative radiation intensity curve in the focus 400 as a function of time 401, i.e., an ideal pulse shape having advantageous properties. Due to the steep increase in the radiation intensity, the transmission period 403 is very short, as the result of which relatively little radiation can be transmitted to the metal layer or metallic structure or the electrical components. The modification design may be controlled very precisely due to the length of the modification period, which preferably may likewise be set very precisely.

The present invention thus relates to a method for producing microcracks 9 in the interior of a composite structure 83. The method according to the invention preferably includes at least the steps: Providing or producing the composite structure 83, wherein the composite structure 83 has a solid body 1 and at least one metallic coating and/or electrical components 82 situated or provided on one side of the solid body 1, and on the other side forms a flat surface 8, wherein the solid body 1 contains or is made of silicon carbide (SiC); producing modifications 9 in the interior of the solid body 1, wherein laser radiation 14 is introduced into the solid body 1 via the flat surface 8, wherein the laser radiation 14 causes multiphoton excitation, wherein the multiphoton excitation brings about plasma generation, wherein the modification is effected by the plasma in the form of a material transformation, wherein the material transformations generate compressive stresses in the solid body 1, wherein the solid body 1 develops subcritical cracks in a surrounding area of the particular modification 9, wherein the modifications 9 are produced at a distance of less than 150 μm from the metallic coating and/or the electrical components 82, wherein the laser radiation 14 is introduced into the solid body 1 in pulses. The pulse intensity of a pulse preferably reaches the maximum pulse intensity within 10 ns after the start of the particular pulse.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing microcracks in an interior of a composite structure, the method comprising:
  providing or producing the composite structure, the composite structure having a solid body and at least one metallic coating and/or electrical components situated or provided on one side of the solid body, an opposing side of the solid body forming a flat surface, the solid body containing or being made of silicon carbide (SiC); and
  producing modifications in the interior of the solid body, wherein laser radiation is introduced into the solid body via the flat surface,
  wherein the laser radiation causes multiphoton excitation,
  wherein the multiphoton excitation brings about plasma generation,
  wherein the modifications are effected by the plasma in the form of a material transformation,
  wherein the material transformation generates compressive stresses in the solid body,
  wherein the solid body develops subcritical cracks in a surrounding area of a particular modification,
  wherein the modifications are produced at a distance of less than 150 μm from the metallic coating and/or the electrical components,
  wherein the laser radiation is introduced into the solid body in pulses,
  wherein pulse intensity of the pulses reaches a maximum pulse intensity within 10 ns after a start of a particular pulse,
  wherein a radiation intensity of a pulse after reaching the maximum has a minimum duration of 10 ps over 50% of the radiation intensity.

2. The method of claim 1, wherein each pulse introduces an energy E into the solid body, and wherein as a result of the plasma generation and/or microcracks already produced, 20% maximum of the energy E of the particular pulse is transmitted through the solid body up to the metallic coating and/or the electrical components.

3. The method of claim 1, wherein the plasma for each pulse is generated within a time x after the start of the pulse, wherein x is shorter than a pulse duration y, wherein x is less than 10 ns.

4. The method of claim 3, wherein $x<0.5*y$.

5. The method of claim 1, wherein beam quality of the laser radiation is less than 1.4.

6. The method of claim 1, wherein the laser radiation is generated with a pulse duration of less than 9 ns.

7. The method of claim 1, wherein the laser radiation is linearly polarized, wherein a polarization direction of the laser radiation is oriented at a defined angle or a defined angular range with respect to a crystal axis of the solid body.

8. The method of claim 1, wherein a direction of a longitudinal extension of the modifications produced in the interior of the solid body is oriented at a defined angle with respect to an intersection line that results at a particular imaginary or virtual interface between a plane on which the modifications are produced and an imaginary or virtual intersection line that results in a crystal lattice plane.

9. The method of claim 1, wherein the laser radiation is introduced into the solid body via at least one optical element, wherein the optical element is a lens having a numerical aperture greater than 0.4.

10. The method of claim 9, wherein prior to penetration into the solid body the laser radiation is led through an immersion solution, and wherein the numerical aperture is greater than 1.

11. The method of claim 1, wherein the individual modifications have a maximum extension in a longitudinal direction of the solid body, wherein the maximum extension of the modifications is in each case less than 100 μm.

12. The method of claim 1, wherein a plurality of modifications is produced to form a linear shape or multiple linear shapes, wherein the subcritical cracks have an average crack length of less than 150 μm orthogonal to a direction of longitudinal extension of a particular linear shape.

13. The method of claim 12, wherein a distance in each case between two directly adjacent linear shapes is less than 400 μm.

14. The method of claim 1, wherein a diffractive optical element is situated in a path of the laser radiation upstream from a penetration of the laser radiation into the solid body, the laser radiation being divided over multiple light paths by the diffractive optical element to produce multiple focuses, wherein the diffractive optical element creates an image field curvature that is less than or equal to 50 μm, and wherein the diffractive optical element simultaneously generates at least 2 focuses for changing one or more material properties of the solid body.

15. The method of claim 1, further comprising:
  introducing an external force into the solid body of the composite structure to produce stresses in the solid body; and/or
  generating an internal force in the solid body, wherein the external and/or internal force cause crack propagation or joining of the subcritical cracks results along a separation area to separate the solid body from the composite structure.

16. A method for producing microcracks in an interior of a composite structure, the method comprising:
providing the composite structure, the composite structure having a solid body and at least one metallic coating and/or electrical components situated or provided on one side of the solid body, an opposing side of the solid body forming a flat surface, the solid body containing or being made of silicon carbide; and
producing modifications in the interior of the solid body,
wherein laser radiation is introduced into the solid body via the flat surface,
wherein the laser radiation causes multiphoton excitation,
wherein the multiphoton excitation brings about plasma generation,
wherein the modifications are effected by the plasma in the form of a material transformation,
wherein the material transformation generates compressive stresses in the solid body,
wherein the solid body develops subcritical cracks in a surrounding area of a particular modification,
wherein the modifications are produced at a distance of less than 150 μm from the metallic coating and/or the electrical components,
wherein the laser radiation is introduced into the solid body in pulses,
wherein each pulse introduces an energy E into the solid body,
wherein as a result of the plasma generation and/or microcracks already produced, 20% maximum of the energy E of the particular pulse is transmitted through the solid body up to the metallic coating and/or the electrical components.

17. The method of claim 16, further comprising:
introducing an external force into the solid body of the composite structure to produce stresses in the solid body; and/or
generating an internal force in the solid body,
wherein the external and/or internal force cause crack propagation or joining of the subcritical cracks results along a separation area to separate the solid body from the composite structure.

18. A method for producing microcracks in an interior of a composite structure, the method comprising:
providing or producing the composite structure, the composite structure having a solid body and at least one metallic coating and/or electrical components situated or provided on one side of the solid body, an opposing side of the solid body forming a flat surface, the solid body containing or being made of silicon carbide (SiC); and
producing modifications in the interior of the solid body,
wherein laser radiation is introduced into the solid body via the flat surface,
wherein the laser radiation causes multiphoton excitation,
wherein the multiphoton excitation brings about plasma generation,
wherein the modifications are effected by the plasma in the form of a material transformation,
wherein the material transformation generates compressive stresses in the solid body,
wherein the solid body develops subcritical cracks in a surrounding area of a particular modification,
wherein the modifications are produced at a distance of less than 150 μm from the metallic coating and/or the electrical components,
wherein the laser radiation is introduced into the solid body in pulses,
wherein pulse intensity of the pulses reaches a maximum pulse intensity within 10 ns after a start of a particular pulse,
wherein the laser radiation is introduced into the solid body via at least one optical element,
wherein the optical element is a lens having a numerical aperture greater than 1,
wherein prior to penetration into the solid body, the laser radiation is led through an immersion solution.

19. A method for producing microcracks in an interior of a composite structure, the method comprising:
providing or producing the composite structure, the composite structure having a solid body and at least one metallic coating and/or electrical components situated or provided on one side of the solid body, an opposing side of the solid body forming a flat surface, the solid body containing or being made of silicon carbide (SiC); and
producing modifications in the interior of the solid body,
wherein laser radiation is introduced into the solid body via the flat surface,
wherein the laser radiation causes multiphoton excitation,
wherein the multiphoton excitation brings about plasma generation,
wherein the modifications are effected by the plasma in the form of a material transformation,
wherein the material transformation generates compressive stresses in the solid body,
wherein the solid body develops subcritical cracks in a surrounding area of a particular modification,
wherein the modifications are produced at a distance of less than 150 μm from the metallic coating and/or the electrical components,
wherein the laser radiation is introduced into the solid body in pulses,
wherein pulse intensity of the pulses reaches a maximum pulse intensity within 10 ns after a start of a particular pulse,
wherein a diffractive optical element is situated in a path of the laser radiation upstream from a penetration of the laser radiation into the solid body, the laser radiation being divided over multiple light paths by the diffractive optical element to produce multiple focuses,
wherein the diffractive optical element creates an image field curvature that is less than or equal to 50 μm,
wherein the diffractive optical element simultaneously generates at least 2 focuses for changing one or more material properties of the solid body.

* * * * *